United States Patent
Nakazawa et al.

(10) Patent No.: US 7,671,705 B2
(45) Date of Patent: Mar. 2, 2010

(54) SURFACE ACOUSTIC WAVE FILTER AND RESONATOR UTILIZING A BRANCH ELECTRODE WITH AN ELECTRICALLY OPENED END

(75) Inventors: Michiyuki Nakazawa, Tokyo (JP); Seisuke Mochizuka, Tokyo (JP); Masaki Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 122 days.

(21) Appl. No.: 11/861,815

(22) Filed: Sep. 26, 2007

(65) Prior Publication Data

US 2008/0079512 A1    Apr. 3, 2008

(30) Foreign Application Priority Data

Sep. 29, 2006    (JP)    .............................. 2006-267536

(51) Int. Cl.
*H03H 9/145*    (2006.01)
*H03H 9/25*    (2006.01)
*H03H 9/64*    (2006.01)

(52) U.S. Cl. ..................... 333/193; 333/195; 310/313 B

(58) Field of Classification Search ......... 333/193–196; 310/313 B, 313 C, 313 D
See application file for complete search history.

(56) References Cited

U.S. PATENT DOCUMENTS

| | | | | |
|---|---|---|---|---|
| 4,023,124 | A | * | 5/1977 | Parker et al. ................. 333/196 |
| 4,160,963 | A | * | 7/1979 | Hays, Jr. ...................... 333/151 |
| 6,072,377 | A | * | 6/2000 | Tajima et al. ................ 333/154 |
| 6,989,724 | B2 | * | 1/2006 | Watanabe et al. ............ 333/133 |
| 7,170,371 | B2 | * | 1/2007 | Ueda et al. ................... 333/195 |
| 7,215,224 | B2 | * | 5/2007 | Noto ............................ 333/202 |
| 7,250,832 | B2 | * | 7/2007 | Kondratiev .................. 333/193 |
| 2002/0190816 | A1 | * | 12/2002 | Takamine .................... 333/195 |

(Continued)

FOREIGN PATENT DOCUMENTS

JP    62-78907    4/1987

(Continued)

OTHER PUBLICATIONS

U.S. Appl. No. 12/046,921, filed Mar. 12, 2008, Takahashi, et al.

*Primary Examiner*—Barbara Summons
(74) *Attorney, Agent, or Firm*—Oblon, Spivak, McClelland, Maier & Neustadt, L.L.P.

(57) ABSTRACT

A SAW filter comprises an IDT disposed on a piezo-electric substrate, wherein the IDT includes comb-shaped electrodes having a plurality of interdigital electrodes arranged in a propagation direction of surface acoustic waves and bus bars for connecting these interdigital electrodes, arranged in opposition, and the interdigital electrodes are crossed with one another. The IDT comprises one or more branch electrodes branched from the interdigital electrode and positioned in a non-overlap zone between an overlap zone at which the interdigital electrodes overlap and the bus bar, and the branch electrode includes a branch electrode body extending in a direction substantially orthogonal to the propagation direction of surface acoustic wave. The SAW filter can be applied to any of a longitudinally coupled multi-mode filter, a ladder type filter, a resonator, a filter having a resonator connected in series to a longitudinally coupled multi-mode filter, and the like. A SAW filter and a SAW resonator highly resistant to damages to the electrodes with high Q and low insertion loss can be provided.

22 Claims, 23 Drawing Sheets

U.S. PATENT DOCUMENTS

| | | | |
|---|---|---|---|
| 2003/0155993 A1* | 8/2003 | Takamine et al. | 333/133 |
| 2005/0001696 A1* | 1/2005 | Otsuka et al. | 333/133 |
| 2006/0043823 A1* | 3/2006 | Obara et al. | 310/313 R |
| 2007/0024397 A1* | 2/2007 | Otsuka et al. | 333/195 |

FOREIGN PATENT DOCUMENTS

| | | |
|---|---|---|
| JP | 06-350383 * | 12/1994 |
| JP | 10-173467 | 6/1998 |
| JP | 11-225038 | 8/1999 |
| JP | 2002-314366 | 10/2002 |
| JP | 2003-309448 | 10/2003 |
| JP | 2003-347882 | 12/2003 |
| JP | 2004-254114 | 9/2004 |
| JP | 2005-159835 | 6/2005 |
| JP | 2005-295049 | 10/2005 |

* cited by examiner

SURFACE ACOUSTIC WAVE FILTER AND RESONATOR UTILIZING A BRANCH ELECTRODE WITH AN ELECTRICALLY OPENED END

BACKGROUND OF THE INVENTION

The present invention relates to a surface acoustic wave filter and a surface acoustic wave resonator, and more particularly, to a device structure which accomplish a high Q-value (ratio of impedance at a resonant frequency and impedance at an anti-resonant frequency) and a low insertion loss in a resonator-type surface acoustic wave filter and a surface acoustic wave resonator for use in mobile communications and the like.

SAW devices which utilize surface acoustic waves (hereinafter called "SAW" in some cases) generated by the piezoelectric effect are widely used in recent years for resonators, filters, duplexers and the like because of their small sizes and light weights as well as suitability for higher performance.

Such a SAW device is generally created by forming a resonator by providing interdigital transducers (hereinafter called "IDT" in some cases) which opposes comb-shaped electrode having a plurality of interdigital electrodes arranged in a propagation direction of surface acoustic waves and bus bars for connecting these interdigital electrodes against each other, and has the interdigital electrodes so overlap as to insert with one another, and electrically or acoustically connecting this.

As connection structures for resonators, there are known a structure which has a plurality of IDTs arranged in a propagation path of surface acoustic waves for acoustic coupling (for example, a longitudinally coupled multi-mode SAW filter), a ladder structure which connects a plurality of resonators in a ladder shape, and the like. Also, attempts have been made to improve electric characteristics by providing a reflector at both ends of each resonator in order to trap surface acoustic waves, varying the geometry of IDT such as an electrode period, the number of electrode pairs, an overlap (insert) length and the like.

For example, the following patent documents disclose such SAW devices, where the following techniques have been created in inventions described in these documents, respectively:

Patent Document 1: JP-A-2005-295049;
Patent Document 2: JP-A-2002-314366;
Patent Document 3: JP-A-2003-309448;
Patent Document 4: JP-A-2005-159835; and
Patent Document 5: JP-A-11-225038.

Patent Document 1 (JP-A-2005-295049) improves an insertion loss and a bandwidth and prevents damages of IDT electrodes by repeatedly providing non-conductive portions and conductive portions at a fixed pitch in bus bars to reduce the velocity of SAW in a bus bar section, and also shifting the center of the conductive portion with respect to the center of an interdigital electrode of a comb-shaped electrode.

Patent Document 2 (JP-A-2002-314366) extends dummy electrodes from bus bars to reduce the distance to the leading end of interdigital electrodes, thereby suppressing SSBW (Surface Skimming Bulk Wave) and improve the flatness of a filter.

Patent Document 3 (JP-A-2003-309448) improves an insertion loss, a bandwidth, and VSWR (Voltage Standing Wave Ratio) in a SAW resonator connected in series to a longitudinally coupled resonator type filter by reducing the distance between a dummy electrode extended from a bus bar and an interdigital electrode, or making the length of the dummy electrode appropriate to shift spurious caused by SSBW.

Patent Document 4 (JP-A-2005-159835) provides a dummy electrode 224 between electrodes and bus bars of an IDT in a longitudinally coupled multi-mode filter so as to restrain radiations of surface acoustic waves in oblique directions. In this way, the SAW velocity outside of a main waveguide is made lower than a SAW velocity at an overlap zone of comb-shaped electrodes which are waveguides, and restrains oblique radiations of the surface acoustic waves, thereby improving an insertion loss and a bandwidth.

Patent Document 5 (JP-A-11-225038) prevents damages of IDT electrodes by connecting a plurality of electrodes from bus bars to interdigital electrodes.

SUMMARY OF THE INVENTION

In recent years, increasingly more strict requirements tend to be imposed to the characteristics of SAW devices with the trend of higher performance, more functions, and higher frequencies of electronic devices represented by mobile communication devices. For example, as a characteristic of a resonator and a filter, the realization of a low insertion loss simultaneously with a high Q-value, a high durability to the temperature and power during manufacturing and actual use, adaptability (degrees of freedom of design) to a variety of design specifications, and the like are required.

However, conventional approaches including the inventions described in the aforementioned Patent Documents attempt to improve the characteristics by processing bus bars in some way such as changing the structure of the bus bar itself, adding dummy electrodes, and the like, but the conventional approaches which modify the structure of the bus bar itself are not able to fully meet the requirements in some aspects.

This is because in the conventional approach which modifies the structure of the bus bar itself (Patent Document 1 and the like), a common electrode (part of the bus bar) exists in a portion near an electrode overlap zone of IDT, to encounter difficulties in reducing the surface acoustic wave velocity in a non-overlap zone (region between the electrode overlap zone of the IDT and the bus bar), thus failing to sufficiently trap surface acoustic waves in the overlap zone of the electrodes.

Also, the SAW device is exposed to high temperatures during manufacturing and practical use, or a high voltage is applied by electrostatic charges accumulated on a piezo-electric substrate, possibly damaging extremely thin and miniaturized IDT electrodes. These damages are often found in bus bar portions which have wide areas in particular. Accordingly, the device structure which attempts to improve the characteristics by modifying the structure of the bus bar can suffer from abolished effects of characteristic improvements and is disadvantageous in regard to damages to the electrodes in some aspects.

It is therefore an object of the present invention to further improve the electric characteristics (particularly, a Q-value and an insertion loss) of a SAW device and the durability against damages to electrodes, and to increase the degree of freedom in the designing of a SAW device by providing a new device structure which is capable of improving the characteristics and durability.

To solve the problem and achieve the object, a SAW (surface acoustic wave) filter comprises an interdigital transducer disposed on a piezo-electric substrate, wherein the interdigital transducer includes comb-shaped electrodes having a plurality of interdigital electrodes arranged in a propagation direction of surface acoustic waves and bus bars for connecting these interdigital electrodes, arranged in opposition, and the interdigital electrodes are so overlapped as to insert with one another. The interdigital transducer comprises one or more branch electrodes branched from the interdigital electrode and positioned in a non-overlap zone between an overlap zone at which the interdigital electrodes overlap with one another and the bus bar, and the branch electrode includes a branch electrode body extending in a direction substantially orthogonal to the propagation direction of surface acoustic wave.

The SAW filter of the present invention improves the characteristics and durability against damages by adding a modification to the interdigital electrodes of the IDT (interdigital transducer) without relying on a modification to the structure of the bus bar.

Specifically, a branch electrode is provided in a region (non-overlap zone of the electrode) between an electrode overlap zone (region in which interdigital electrodes overlap with one another) of the IDT and the bus bar. This branch electrode includes a branch electrode body which extends in a direction substantially orthogonal to the propagation direction of surface acoustic waves, and the branch electrode body is disposed in the non-overlap zone, thereby making it possible to reduce the velocity of surface acoustic waves in a region outside of the overlap zone, trap the surface acoustic waves within the overlap zone, and prevents a leak of the surface acoustic waves out of the overlap zone.

Particularly, in the present invention, the electrode for reducing the velocity of the surface acoustic wave is branched from the interdigital electrode, rather than extending from the bus bar, and the bus bar per se is not modified in shape (the bus bar is provided with non-conductive portions as in the aforementioned Patent Document 1), so that no common electrode (electrode continuous in the propagation direction of the surface acoustic wave) exists near the overlap zone, and the velocity of the surface acoustic wave can be reduced in a portion closer to the overlap zone, thus making it possible to better prevent a leak of the surface acoustic wave as compared with before to achieve a high Q-value and a low insertion loss.

Also, since the present invention does not add modifications to the bus bar which is susceptible to damages due to a temperature load and the like, the improved electric characteristic can be lost due to a damaged electrode (bus bar) with a reduced possibility, resulting in a higher durability against damages and increased degrees of freedom in designing as compared with the conventional device structure which depends on modifications to the structure of the bus bar and on dummy electrodes.

While the present invention is characterized by providing the branch electrode in this way, modifications to the structure of the bus bar and the addition of the dummy electrodes, as before, in combination with the branch electrode, are not prohibited, and the branch electrode may be provided in addition to the modifications to the structure of the bus bar and the dummy electrodes.

The branch electrode may have its leading end electrically opened. By keeping the leading end electrically open, the electric potential between adjacent (to which the branch electrode is connected) interdigital electrodes is not uniform (an electric potential difference can be produced between the interdigital electrode to which the branch electrode is connected and the branch electrode), and an electric potential distribution in the non-overlap zone is not uniform, so that the surface acoustic wave can be better trapped within the overlap zone.

The structure having such a branch electrode can be applied to a longitudinally coupled multi-mode SAW filter as well, and can produce similar effects. Specifically, a longitudinally coupled multi-mode SAW filter of the present invention comprises a plurality of interdigital transducers disposed on a piezo-electric substrate so as to be acoustically coupled in the propagation direction of surface acoustic waves, wherein each interdigital transducer including comb-shaped electrodes having a plurality of interdigital electrodes arranged in a propagation direction of surface acoustic waves and bus bars for connecting these interdigital electrodes, arranged in opposition, and the interdigital electrodes is so overlapped as to insert with one another. Each interdigital transducer comprises one or more branch electrodes branched from the interdigital electrode and positioned in a non-overlap zone between an overlap zone at which the interdigital electrodes overlap with one another and the bus bar, and the branch electrode includes a branch electrode body extending in a direction substantially orthogonal to the propagation direction of surface acoustic wave.

Further, in the present invention, a longitudinally coupled multi-mode SAW filter comprises a first SAW filter and a second SAW filter connected in parallel with each other, wherein the SAW filter according to the present invention can be used as these first and second SAW filters.

Also, a SAW resonator is connected in series to these longitudinally coupled multi-mode SAW filters. As this resonator, a resonator of the present invention described next, for example, may be utilized.

A resonator according to the present invention is a SAW resonator which comprises an interdigital transducer disposed on a piezo-electric substrate, wherein the interdigital transducer includes comb-shaped electrodes having a plurality of interdigital electrodes arranged in a propagation direction of surface acoustic waves and bus bars for connecting these interdigital electrodes, arranged in opposition, and the interdigital electrodes is crossed with one another, wherein the interdigital transducer comprises one or more branch electrodes branched from the interdigital electrode and positioned in a non-overlap zone between an overlap zone at which the interdigital electrodes overlap with one another and the bus bar, and the branch electrode includes a branch electrode body extending in a direction substantially orthogonal to the propagation direction of surface acoustic wave.

As described above, the present invention can be applied to the resonator as well, and can produce similar effects to those described in connection with the aforementioned filter.

In the SAW filter or the resonator according to the present invention, $W1 \geq 0.08\lambda$ is preferably established where $\lambda$ is the electrode period of the interdigital electrodes, and $W1$ is the width of the branch electrodes. In this connection, the electrode period $\lambda$ of the interdigital electrodes refers to an electrode pitch at which adjacent electrodes belonging to the same comb-shaped electrode and extending in the same direction are arranged (see FIG. 2).

Also, $G1 \leq 0.36\lambda$ is preferably established, where $G1$ is the spacing between an end of the branch electrode body on the overlap zone side and the leading end of the interdigital electrode of an opposing comb-shaped electrode.

Further, $L1 \geq 0.21\lambda$ is preferably established, where $L1$ is the length of the branch electrode body.

Any of these equations relates to the Q-value and insertion loss, and is intended to achieve a better characteristic improvement effect. These preferred values will be described in greater detail in embodiments, later described, based on actually measured data.

In the present invention, a ladder type SAW filter can also be configured. The ladder type surface acoustic wave filter comprises one or more series arm resonators connected in series on a transmission path between an input terminal and an output terminal, and one or more parallel arm resonators connected to a branch path branched from the transmission path, wherein the surface acoustic wave resonator according to the present invention is used as at least one resonator of the one or more series arm resonators and one or more parallel arm resonators.

Further, in the SAW filter or SAW resonator of the present invention, a piezo-electric substrate which undergoes pyro-elestric property improvement processing may be used as the piezo-electric substrate.

This is intended to further improve the durability of the transducers against electrostatic discharge damages. Since a piezo-electric substrate generally has pyro-electic properties, a non-uniform charge distribution is generated on the surface of the substrate due to fluctuations in temperature. The charge, if accumulated, can cause degraded characteristics during the manufacturing of devices and during actual uses after the devices are mounted in a variety of electronic devices, and damages to the transducers due to an electric discharge of an IDT portion. In contrast, when a piezo-electric substrate which undergoes the pyro-electoric property improvement processing is used as the piezo-electric substrate, such problems can be avoided to provide a more reliable SAW filter or SAW resonator.

Specifically, the pyro-electric property improvement processing refers to (1) adding an additive to a piezo-electric substrate; (2) performing reduction processing; or (3) reducing the volume resistance of the piezo-electric substrate by another method.

More specifically describing the method (1) listed above, a $LiTaO_3$ (hereinafter called "LT") substrate, or a $LiNbO_3$ (hereinafter called "LN") substrate, for example is used as a piezo-electric substrate, and one or more of additives are added to the substrate, including, for example, iron (Fe), cobalt (Co), nickel (Ni), manganese (Mn), copper (Cu), titanium (Ti) and the like. A manipulation for mixing the additive can be performed by adding any of the additives listed above to a melted piezo-electric material when a single crystal of the piezo-electric material is produced, for example, by a Czochralski process. In regard to the method (2) listed above, the reduction processing may be performed for removing oxygen in a single crystal which constitutes a piezo-electric substrate, after the crystal is pulled up and sliced.

According to the present invention, it is possible to improve the electric characteristics of the SAW device (particularly, the Q-value and insertion loss) and the durability against damages to the electrode and also to increase the degree of freedom in designing.

BRIEF DESCRIPTION OF THE DRAWINGS

Other objects, features, and advantages of the present invention will be made apparent from the following description of embodiments and examples of the present invention. In the drawings, the same reference numerals designate the same or equivalent parts, wherein.

DESCRIPTION OF THE EMBODIMENTS

First Embodiment

Figure 1:
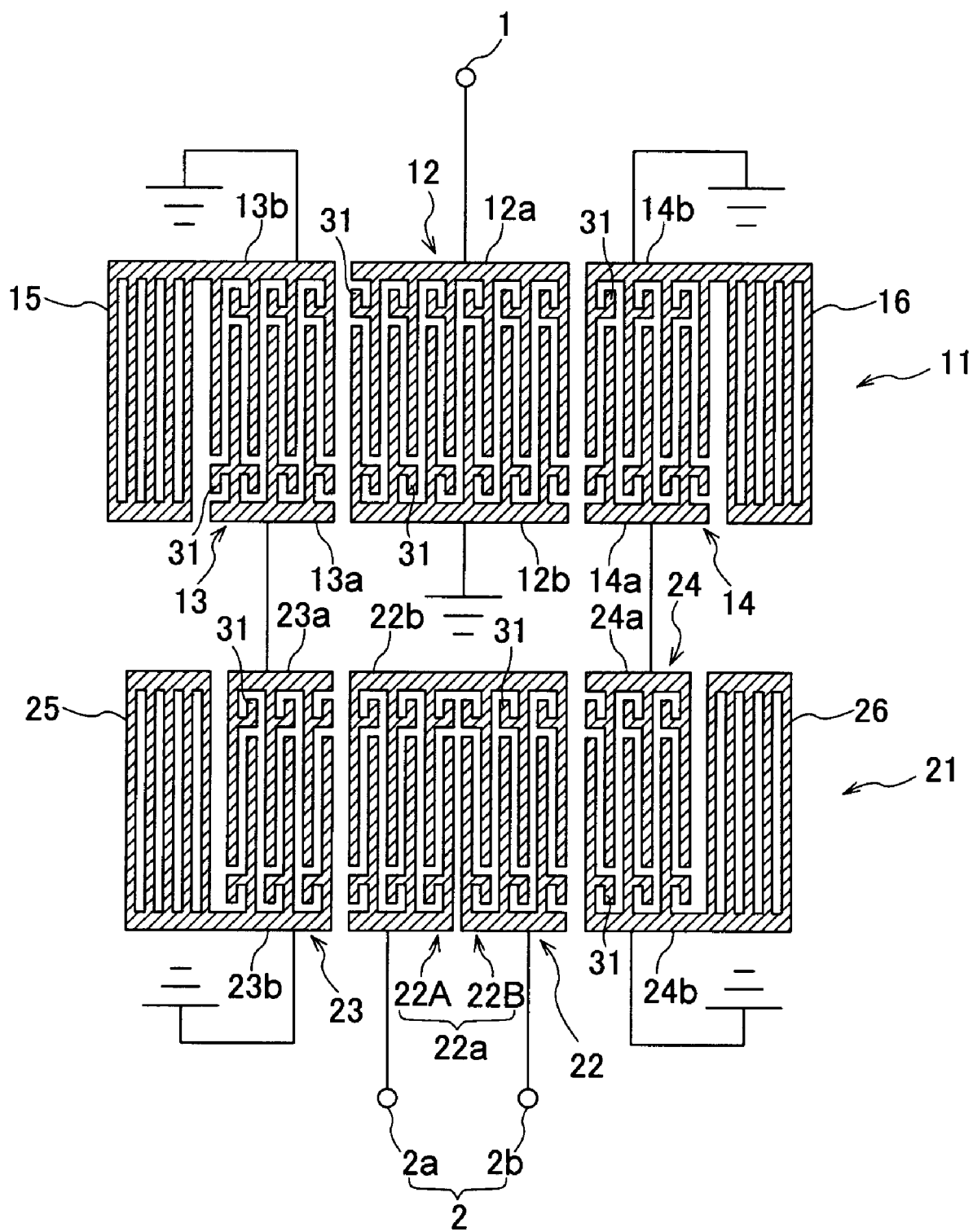
FIG. 1 is a diagram showing a longitudinally coupled multi-mode SAW filter according to a first embodiment of the present invention.
Figure 2:
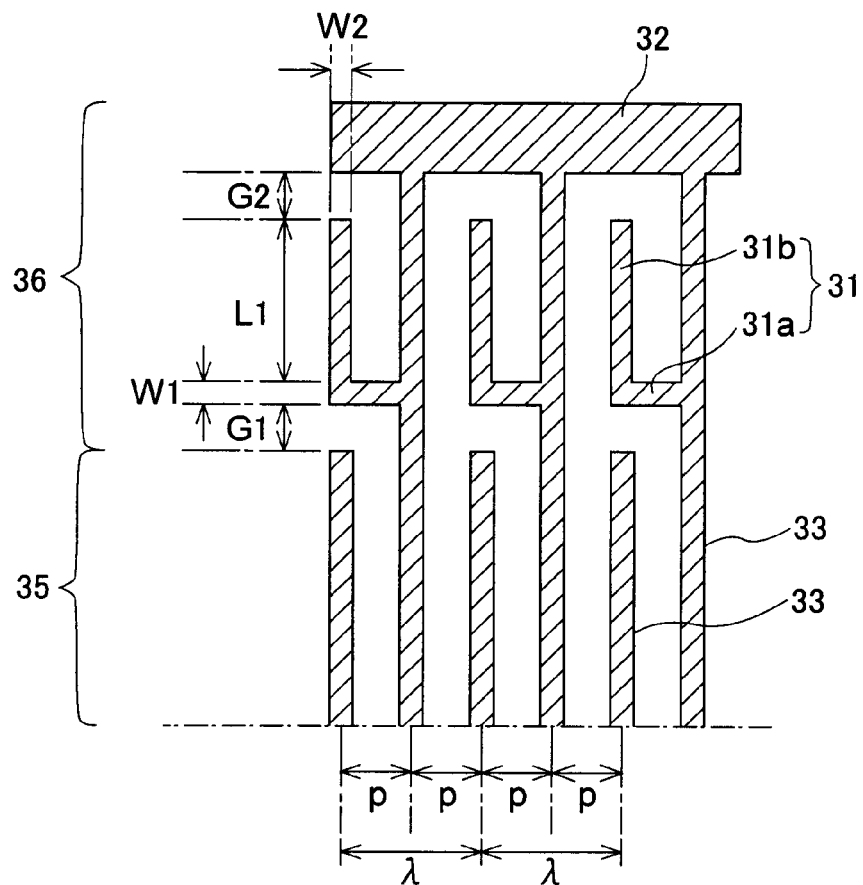
FIG. 2 is a diagram showing, in an enlarged view, a electrode non-overlap zone of IDT of the filter according to the first embodiment of the present invention.

FIGS. 1 and 2 show a longitudinally coupled multi-mode SAW filter according to a first embodiment of the present invention. As shown in these figures, this SAW filter comprises two longitudinally coupled multi-mode SAW filters 11, 21 connected in series between an input terminal 1 and an output terminal 2. The SAW filter 11 at a first stage connected to the input terminal 1 comprises three IDTs 12, 13, 14 linearly arranged (in a line) and acoustically coupled in a propagation direction of surface acoustic waves; and reflectors 15, 16 disposed outside the IDTs 13, 14 on both the left and right sides. These components are formed on a piezo-electric substrate. It should be noted that in these figures (similar in other figures, later described), the number of shown electrodes is smaller than the actual number for simplifying the illustration of each IDT and reflector.

Each IDT 12, 13, 14 which forms part of the filter 11 at the first stage comprises comb-shaped electrodes 12a, 12b, 13a, 13b, 14a, 14b, each of which includes a bus bar 32 and a plurality of interdigital electrodes 33 extending therefrom, arranged in opposition to each other. Each interdigital electrode 33 comprises a branch electrode 31 which branches from the proximal end thereof (portion close to a connection with the bus bar 32). These branch electrodes 31 comprise a branch portion 31a extending substantially orthogonal to the interdigital electrode 33 and in parallel with a propagation direction of surface acoustic waves; and a branch body 31b bent substantially at right angles from the leading end of the branch portion 31a and extending substantially in parallel with the interdigital electrode 33 toward the bus bar 32 to which the branch electrode 31 is connected through the interdigital electrode 33 (in a direction substantially orthogonal to the propagation direction of surface acoustic waves), and generally has substantially an L-shape.

The leading end of the branch electrode 31 (branch body 31b) is a free end which is electrically open without being connected to any of the bus bar 32, other electrodes or the like. Also, these branch electrodes 31 are disposed within a region (non-overlap zone) 36 between an overlap zone 35 at which the interdigital electrodes 33 of both comb-shaped electrodes overlap with one another and the bus bar 32. Out of two comb-shaped electrodes 12a, 12b, 13a, 13b, 14a, 14b which are disposed in opposition and form part of each IDT 12, 13, 14, one is connected to a signal line, while the other is connected to a ground.

The SAW filter 21 at the second stage connected in series between the filter 11 at the first stage and the output terminal 2 is similar to the filter 11 at the first stage in that it comprises three acoustically coupled IDTs 22, 23, 24, and reflectors 25, 26 disposed on both sides thereof, and an interdigital electrode 33 of each IDT 22, 23, 24 comprises a branch electrode 31. However, among the three IDTs 22, 23, 24 arranged in a line in the propagation direction of surface acoustic waves, the central IDT 22 is divided into two portions in the propagation direction of surface acoustic waves, and balanced output terminals 2a, 2b are connected to the divided portions 22A, 22B, respectively.

The filter according to this embodiment can have, for example, the following specification, assuming an EGSM receiving filter, the center frequency of which is 942.5 MHz.

As a piezo-electric substrate, a 42±6° Y-cut X-propagation LT substrate which has undergone pyro-electric property improvement processing by adding an additive (for example Fe) is used. The electrodes of each IDT 12, 13, 14, 22, 23, 24 and the reflectors 15, 16, 25, 26 are made, for example, of an Al single crystal film, and have a thickness of approximately 320 nm by way of example. Also, in this event, as an underlying layer, a TiN film having a thickness of 4 nm, by way of example, is formed in order to facilitate the single crystallization. For the fabrication, a pattern of each SAW filter 11, 21 is formed on the surface of the piezo-electric substrate using a known photolithography (photo-etching) technique, singulated into individual pieces by dicing, mounted on a ceramic substrate by flip-chip bonding, and encapsulated with a resin. The input terminal 1 and output terminal 2 are an unbalanced input terminal having an input impedance of 50 Ω, and a balanced output terminal having an output impedance of 150 Ω, respectively.

Dimensions of each portion and the number of electrodes of the filter 11 at the first stage are, for example, as follows:

Average Electrode Period λ of IDT Electrodes: 4.222 μm
Average Electrode Pitch p of IDT Electrodes: 2.111 μm
Electrode Pitch of Reflector: 2.129 μm Number of Electrode Pairs of IDTs: 23 pairs in the central IDT 12, and 14.5 pairs in the outside IDTs 13, 14
Number of Electrodes of Reflector: 70
Overlap Length (Length of Overlap Zone of Electrodes): 46λ
Distance between IDT and Reflector: 0.5λ
DUTY: 0.7 for Both IDT and Reflector The average electrode period λ of the IDT refers to an average value of an arrangement pitch (twice the electrode pitch p) of adjoining interdigital electrodes which belong to the same comb-shaped electrode and extend in the same direction. Also, when the electrode pitch of several electrodes (narrow-pitch electrodes) near another adjacent IDT is made smaller than the pitch of electrodes in other portion, there is an effect of reducing an insertion loss within a pass band, as has been previously known, so that the IDTs 12, 13, 14 of this embodiment employ such a structure (true in the filter 21 at the second stage and embodiments, later described, as well). Accordingly, the average electrode period and average electrode pitch refer to averages of the electrode periods and electrode pitches of all electrodes of the IDT electrode, respectively.

Dimensions of each portion and the number of electrodes of the filter 21 at the second stage are, for example, as follows:
Average Electrode Period λ of IDT Electrodes: 4.222 μm
Electrode Pitch of Reflector: 2.141 μm
Number of Electrode Pairs of IDTs: 30 pairs in the central IDT 22 (divided into two at the center and connected in series), and 13 pairs in the outside IDTs 23, 24
Number of Electrodes of Reflector: 70
Overlap Length (Length of Overlap Zone of Electrodes): 48λ
Distance between IDT and Reflector: 0.5λ
DUTY: 0.7 for Both IDT and Reflector Dimensions of each part of the branch electrode 31 are, for example, as follows:
Width W1 of Branch Portion 31*a*: 1 μm (=0.24λ)
Width W2 of Branch Body 31*b*: Same as Width of Interdigital Electrode
Gap G1 between Leading End of Interdigital Electrode 33 and Branch Electrode 31: 0.5 μm (=0.12 λ)
Length L1 of Branch Body 31*b*: 3.3 μm (0.78λ)
Gap G2 between Leading End of Branch Body 31*b* and Bus Bar 32: 0.7 μm (=0.17λ)

The frequency characteristic of the filter according to the first embodiment fabricated in accordance with such specifications was measured. For purposes of comparison, two types of filters which have two longitudinally coupled multi-mode SAW filters comprising three IDTs and reflectors provided on both sides thereof, like this embodiment, connected in series between an unbalanced signal input terminal and a balanced signal output terminal, in accordance with a conventional filter structure, were prepared.

Among these, a filter according to a first comparative example does not comprise an additional structure (modified shape of bus bar, dummy electrode, and the like) in any of bus bars or interdigital electrodes of each IDT 202, 203, 204, 212, 213, 214 which form part of any of the filter 201 at the first stage and the filter 211 at the second stage. A filter according to a second comparative example comprises, as shown in FIG. 35, a structure similar to the aforementioned Patent Document 1 which alternately comprise conductive portions and non-conductive portions in bus bars of each IDT 222, 223, 224, 232, 233, 234 which forms part of the filter 221 at the first stage and the filter 231 at the second stage.

Figure 3:
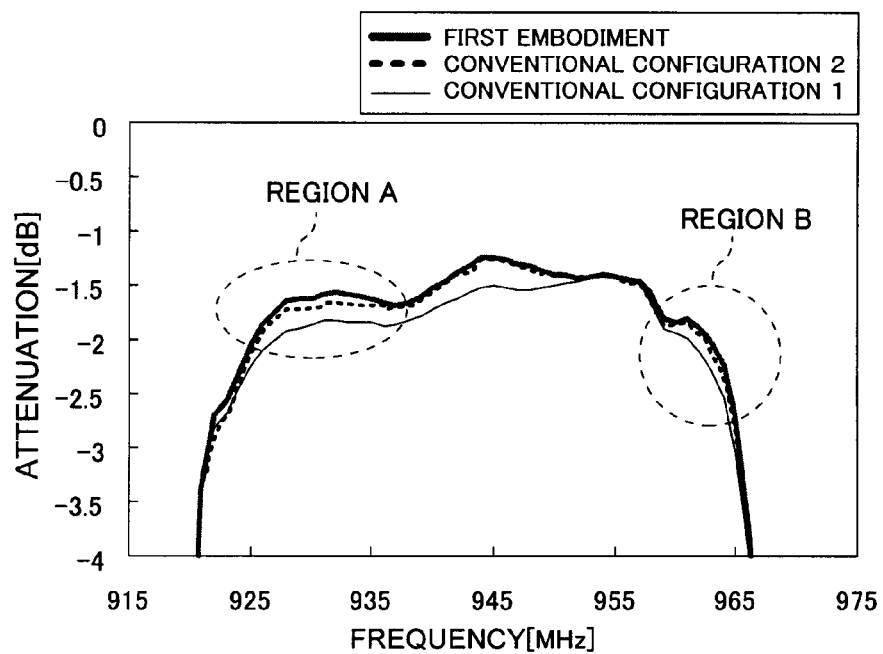
FIG. 3 is a graph showing a frequency-attenuation characteristic in a pass band of the filter according to the first embodiment in comparison with a filter of a conventional structure.
Figure 34:
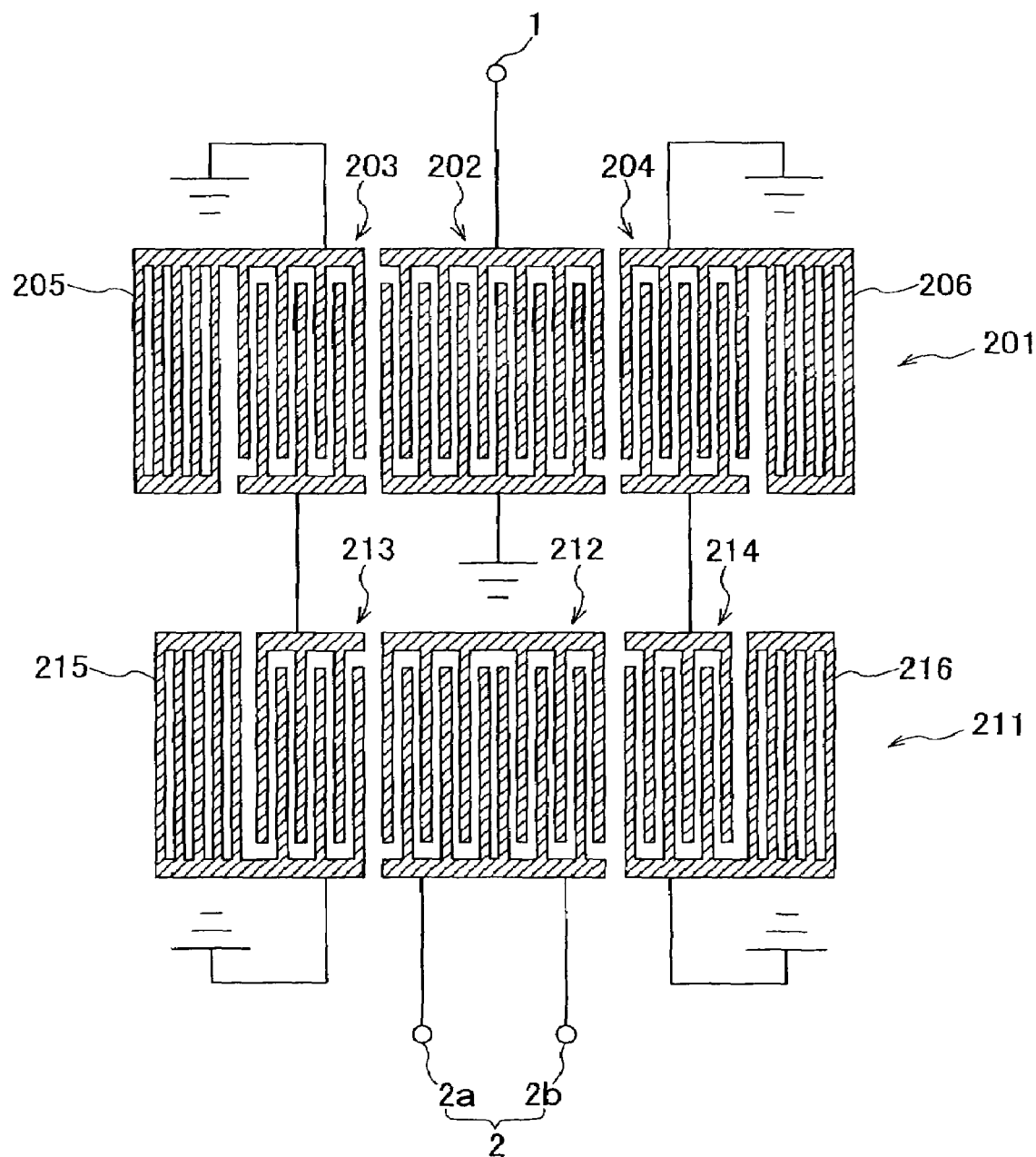
FIG. 34 is a diagram showing the longitudinally coupled multi-mode SAW filter according to a first comparison example which is configured in accordance with a conventional filter structure.
Figure 35:
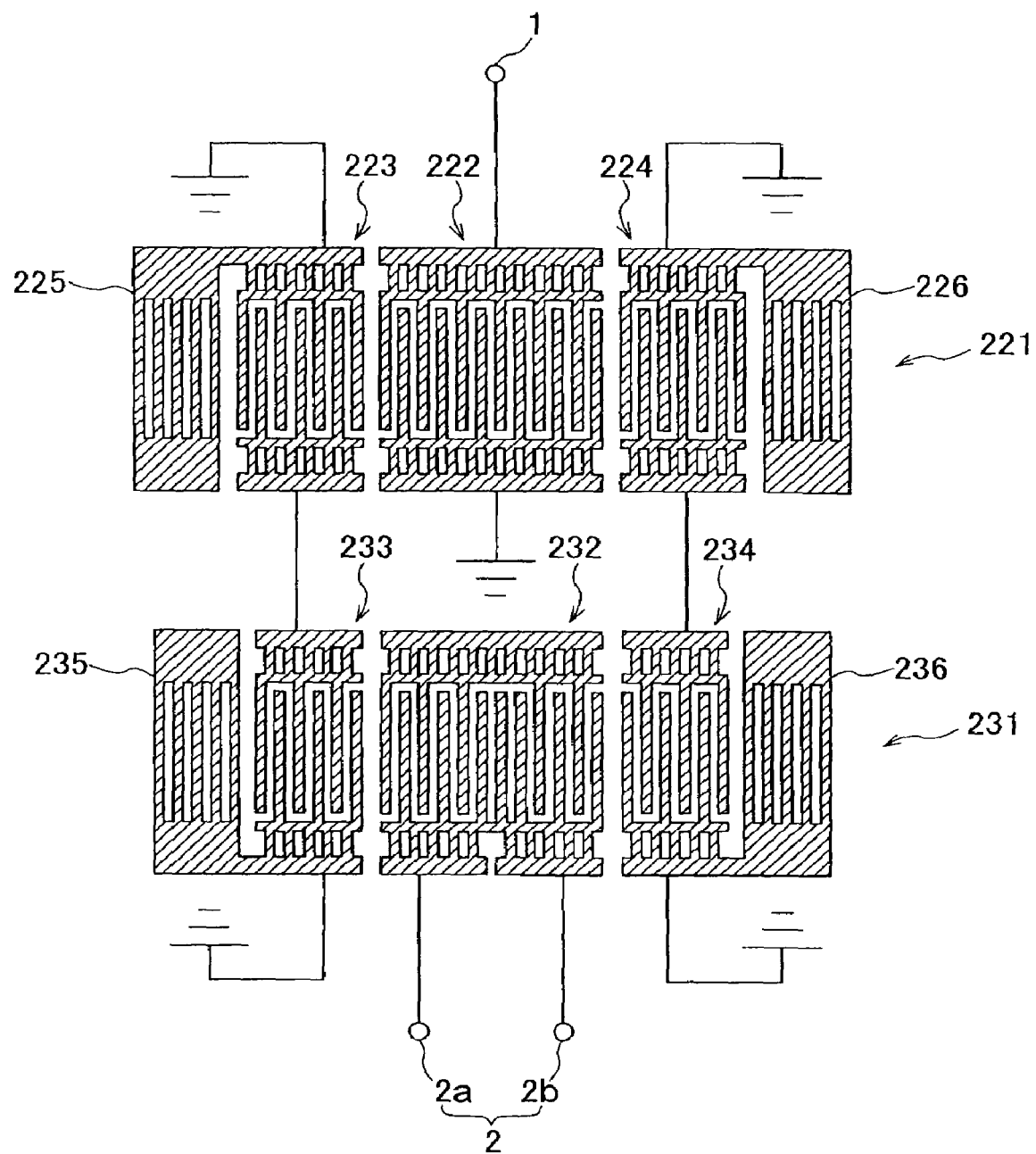
FIG. 35 is a diagram showing the longitudinally coupled multi-mode SAW filter according to a second comparison example which is configured in accordance with a conventional filter structure.

FIG. 3 shows the frequency-attenuation characteristic in a pass band of each filter according to this embodiment, the comparative example 1 (conventional structure 1/FIG. 34), and the comparative example 2 (conventional structure 2/FIG. 35). As is apparent from this figure, according to the filter structure of this embodiment, as compared with the conventional filter structures, a large characteristic improvement effect is achieved particularly in both shoulder portions of the pass band, i.e., on a lower side (region A) and a higher side (region B) of the pass band.

Defining the lower side region A of the pass band in a range of 925 MHz to 935 MHz for comparing minimum insertion losses in this range, an improvement effect as compared with the conventional configuration 1 (only extending the electrodes simply from the bus bar) is approximately 0.24 dB, and an improvement effect of approximately 0.07 dB can be confirmed as compared with the conventional configuration 2 (the conductive portions and non-conductive portions are provided in the bus bar). This is thought that according to the filter structure of this embodiment, the SAW velocity in a portion nearer the electrode overlap zone of the IDT can be reduced, thus achieving a further reduction in loss.

Figure 4:
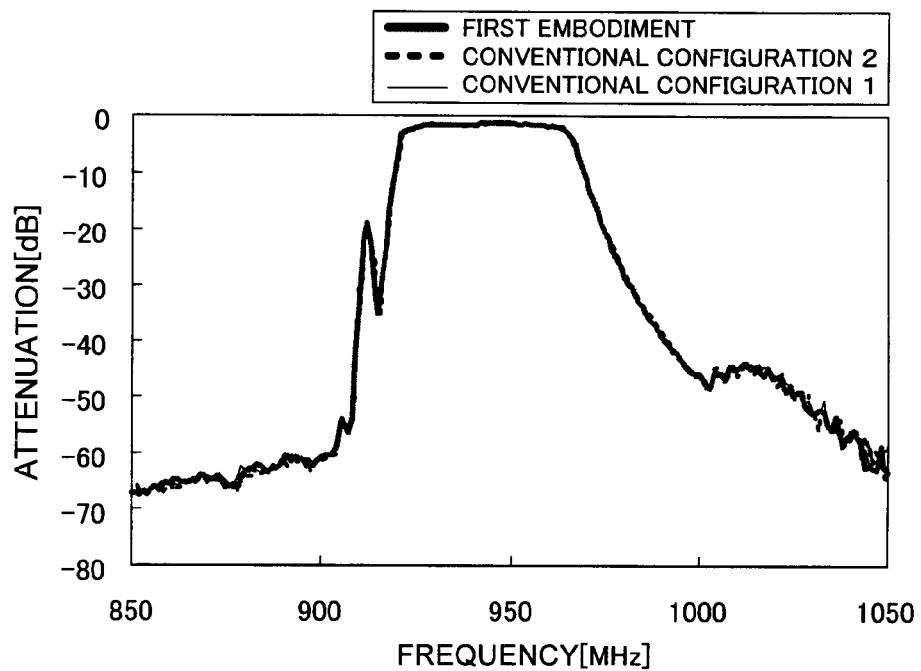
FIG. 4 is a graph showing a frequency characteristic out of the pass band of the filter according to the first embodiment in comparison with a filter of a conventional structure.

FIG. 4 in turn shows the results of measuring the frequency characteristic out of the pass band, from which it can be seen that this embodiment and the conventional configurations 1, 2 exhibit substantially the same characteristic, and the characteristic out of the band is not affected even if the structure of this embodiment is employed.

Figure 5:
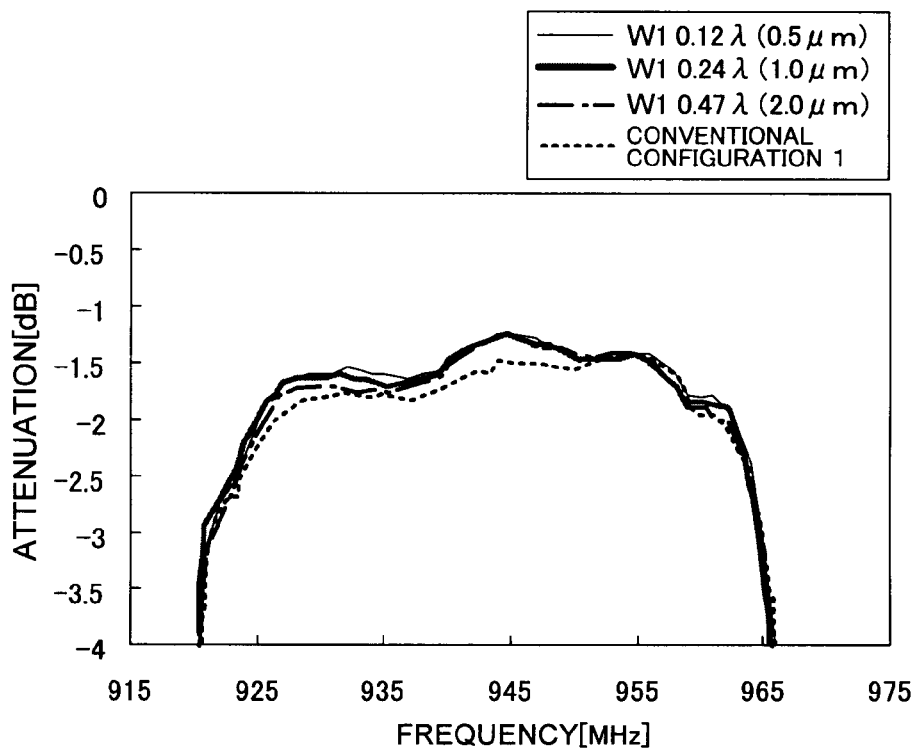
FIG. 5 is a graph showing the frequency characteristic when the width W1 of a branch portion of a branched electrode is changed in the filter according to the first embodiment in comparison with a filter of a conventional structure.
Figure 6:
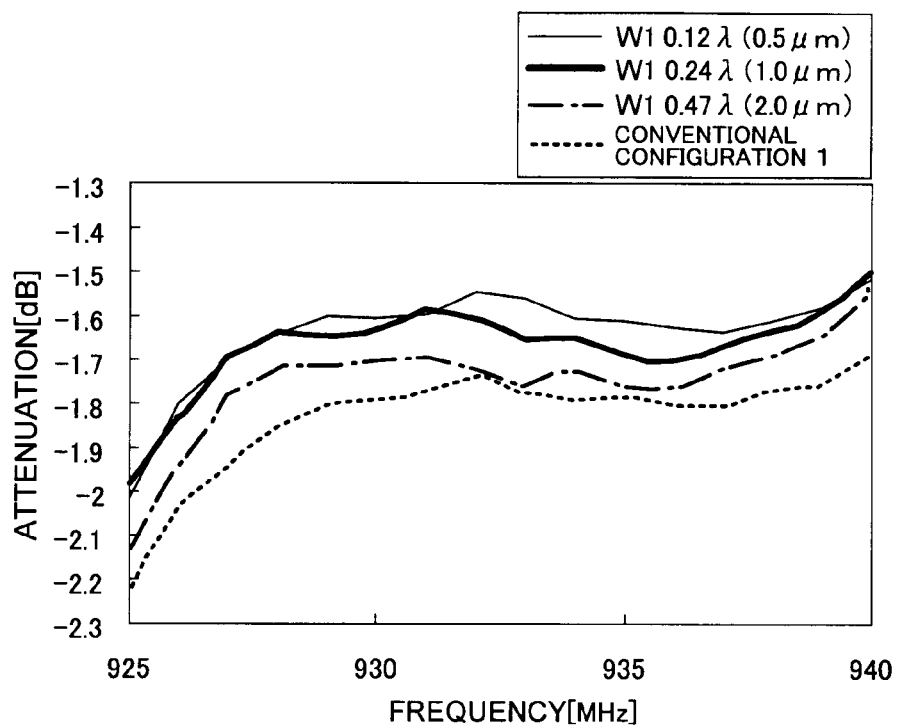
FIG. 6 is a graph showing in an enlarged view a shoulder portion on the lower side of the pass band in the graph of FIG. 5.

FIG. 5 in turn shows the frequency characteristic when the width W1 of the branch portion 31*a* of the branch electrode 31 is varied, specifically, when W1=0.5 μm (0.12λ), 1 μm (0.24λ), and 2.0 μm (0.47λ), in comparison with the conventional configuration 1. FIG. 6 shows the region A in FIG. 5 in an enlarged view. As is apparent from these figures, while any structure according to the present invention provides a good frequency characteristic as compared with the conventional configuration 1, and it can be seen that the characteristic is further improved as the width W1 of the branch portion 31*a* is reduced from 0.47λ to 0.24λ and further to 0.12λ.

Figure 7:
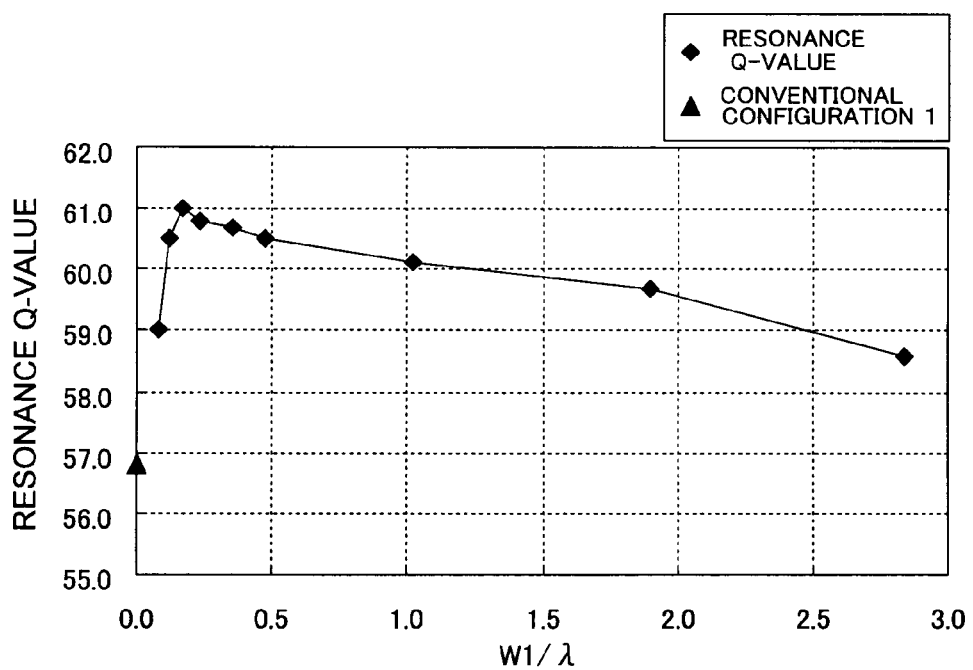
FIG. 7 is a graph showing the resonance characteristic of the filter at the first stage in the first embodiment.
Figure 8:
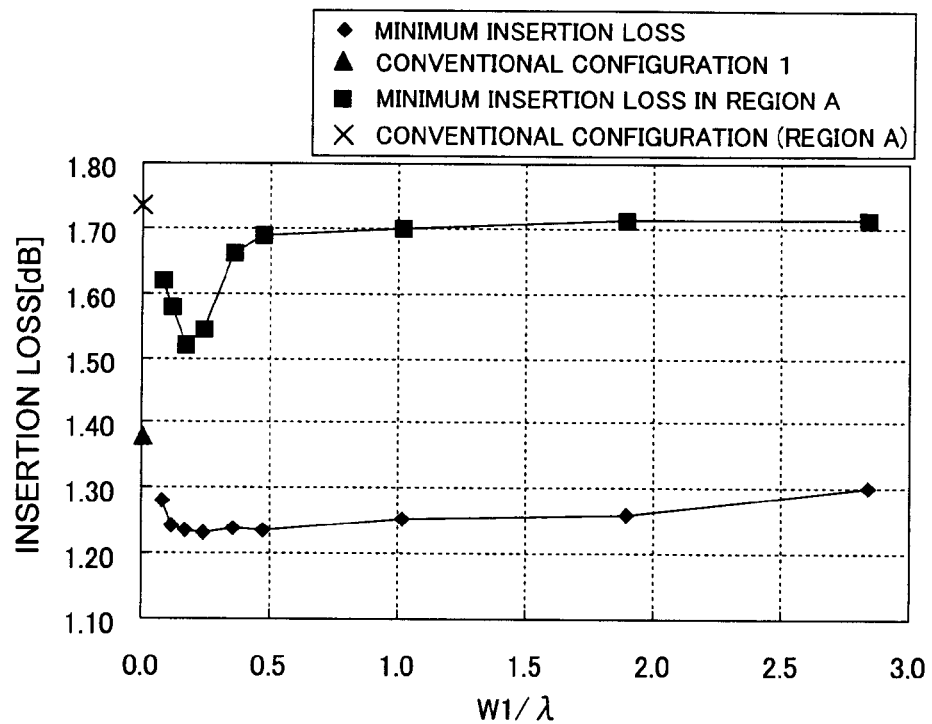
FIG. 8 is a graph showing a change in insertion loss when a width W1 of a branch portion of a branched electrode is changed in the filter according to the first embodiment.

FIG. 7 shows the result of measuring the resonance characteristic of the filter 11 at the first stage according to this embodiment, wherein measured values of Q-value are shown when the width W1 of the branch portion 31*a* of the branch electrode 31 is varied, specifically, when W1=0.35 μm (0.08λ), 0.5 μm (0.12λ), 0.7 μm (0.17λ), 1 μm (0.24λ), 1.5 μm (0.36λ), 2 μm (0.47λ), 4.3 μm (1.02λ), 8 μm (1.89λ), and 12 μm (2.84λ) (similar in FIG. 8 as well). In this graph, a point of W1/λ=0 (solid black triangle ▲) is a measurement result of a filter of the comparative example 1 (conventional configuration 1 ) which comprises the conventional structure. Also, while as a document which shows a method of measuring and evaluating the resonance characteristic of a multi-mode filter, there is Jpn. J. Appl. Phys. Vol. 36 (1997), pp. 3102-3103, and FIG. 7 shows the result of a measurement which was performed based on a zero-th mode measurement method described in this document.

As is apparent from this measurement result, it can be understood that according to the filter structure of this embodiment, the SAW velocity in a region outside of the IDT electrode overlap zone can be efficiently reduced simply by modifying the shape of the interdigital electrodes to improve the Q-value of resonance and accomplish a low loss characteristic.

Further, FIG. 8 shows the result of measuring a change in insertion loss (a minimum value of the insertion loss in the pass band, and a minimum value of the insertion loss in the region A) when the width W1 of the branch portion 31*a* of the branch electrode 31 is changed in a manner similar to FIG. 7. As is apparent from this measurement result, W1≧0.08λ is preferably established in order to reduce the insertion loss, and particularly, $0.08\lambda \leq W1 \leq 2.84\lambda$ is preferably established, and $0.08\lambda \leq W1 \leq 0.36\lambda$ is more preferably established.

Figure 9:
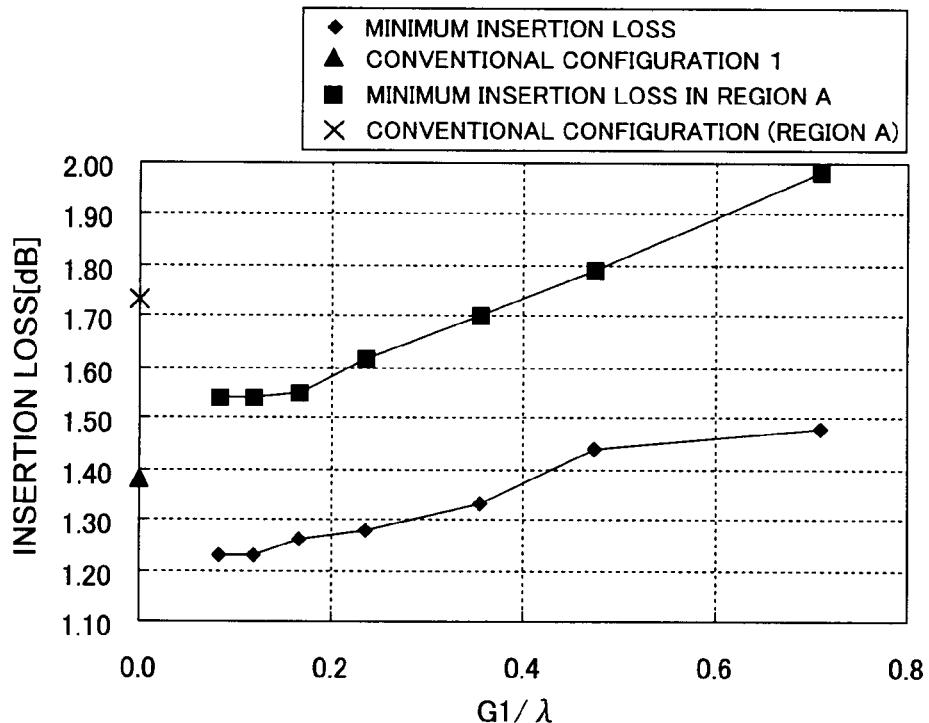
FIG. 9 is a graph showing a change in insertion loss when a gap G1 between the leading end of an interdigital electrode and a branch electrode is changed in the filter according to the first embodiment.

FIG. 9 shows the result of measuring a change in insertion loss (a minimum value of the insertion loss in the pass band, and a minimum value of the insertion loss in the region A) when the gap G1 between the leading end of the interdigital electrode 33 and branch electrode 31 is change, specifically, when G1=0.35 μm (0.08λ), 0.5 μm (0.12λ), 0.7 μm (0.17λ), 1 μm (0.24λ), 1.5 μm (0.36λ), 2.0 μm (0.47λ), and 3.0 μm (0.71λ). As is apparent from this measurement result, $G1 \leq 0.36\lambda$ is preferably established in order to reduce the insertion loss, and particularly, $0.08\lambda \leq G1 \leq 0.36\lambda$ is desirably established.

Figure 10:
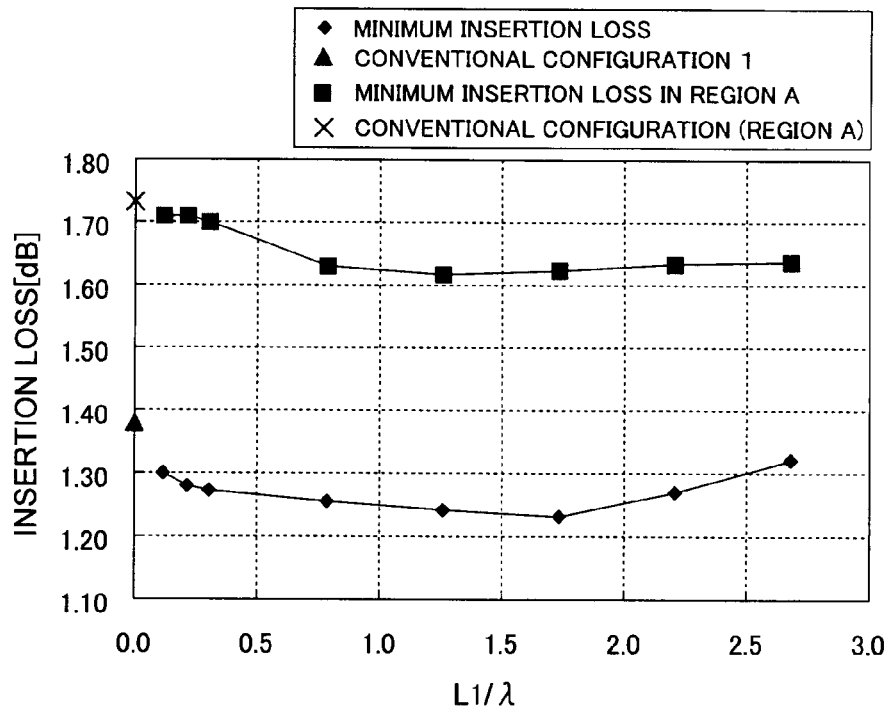
FIG. 10 is a graph showing a change in insertion loss when a length L1 of a branch electrode body of the branch electrode is changed in the filter according to the first embodiment.

FIG. 10 shows the result of measuring a change in insertion loss (a minimum value of the insertion loss in the pass band, and a minimum value of the insertion loss in the region A) when the length L1 of the branch body 31b of the branch electrode 31 is change, specifically, when L1=0.5 μm (0.12λ), 0.9 μm (0.21λ), 1.31 μm (0.31λ), 3.3 μm (0.78λ), 5.3 μm (1.26λ), 7.3 μm (1.73λ), 9.3 μm (2.2λ), and 11.3 μm (2.68λ). As is apparent from this measurement result, $L1 \geq 0.12\lambda$ is preferably established in order to reduce the insertion loss, and particularly, $0.12\lambda \leq L1 \leq 2.68\lambda$ is desirably established.

Figure 11:
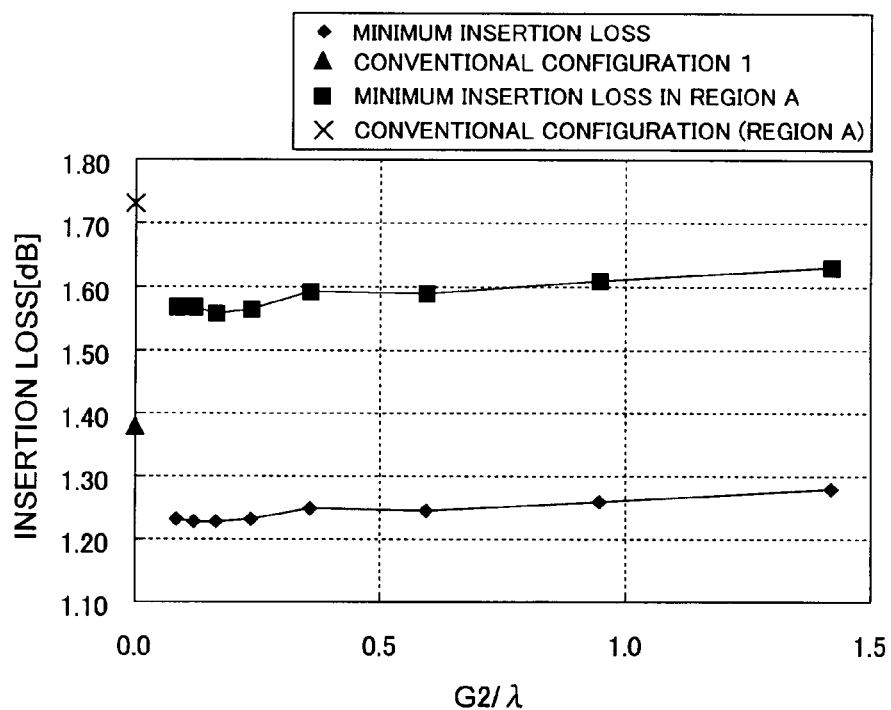
FIG. 11 is a graph showing a change in insertion loss when a gap G2 between the leading end of a branch electrode (branch electrode body) and a bus bar in the filter according to the first embodiment.

FIG. 11 shows the result of measuring a change in insertion loss (a minimum value of the insertion loss in the pass band, and a minimum value of the insertion loss in the region A) when the gap G2 between the leading end of the branch electrode 31 (branch body 31b) and bus bar 32 is change, specifically, when G2=0.35 μm (0.08λ), 0.5 μm (0.12λ), 0.7 μm (0.17λ), 1.0 μm (0.24λ), 1.5 μm (0.36λ), 2.5 μm (0.59λ), 4.0 μm (0.95λ), and 6.0 μm (1.42λ). In regard to the gap G2, the insertion loss can be reduced when it is set to any value, G2 is desirably up to a size which at which the electrode resistance does not cause a problem (for example, $0.08\lambda \leq G2 \leq 1.42\lambda$).

Second Embodiment

Figure 12:
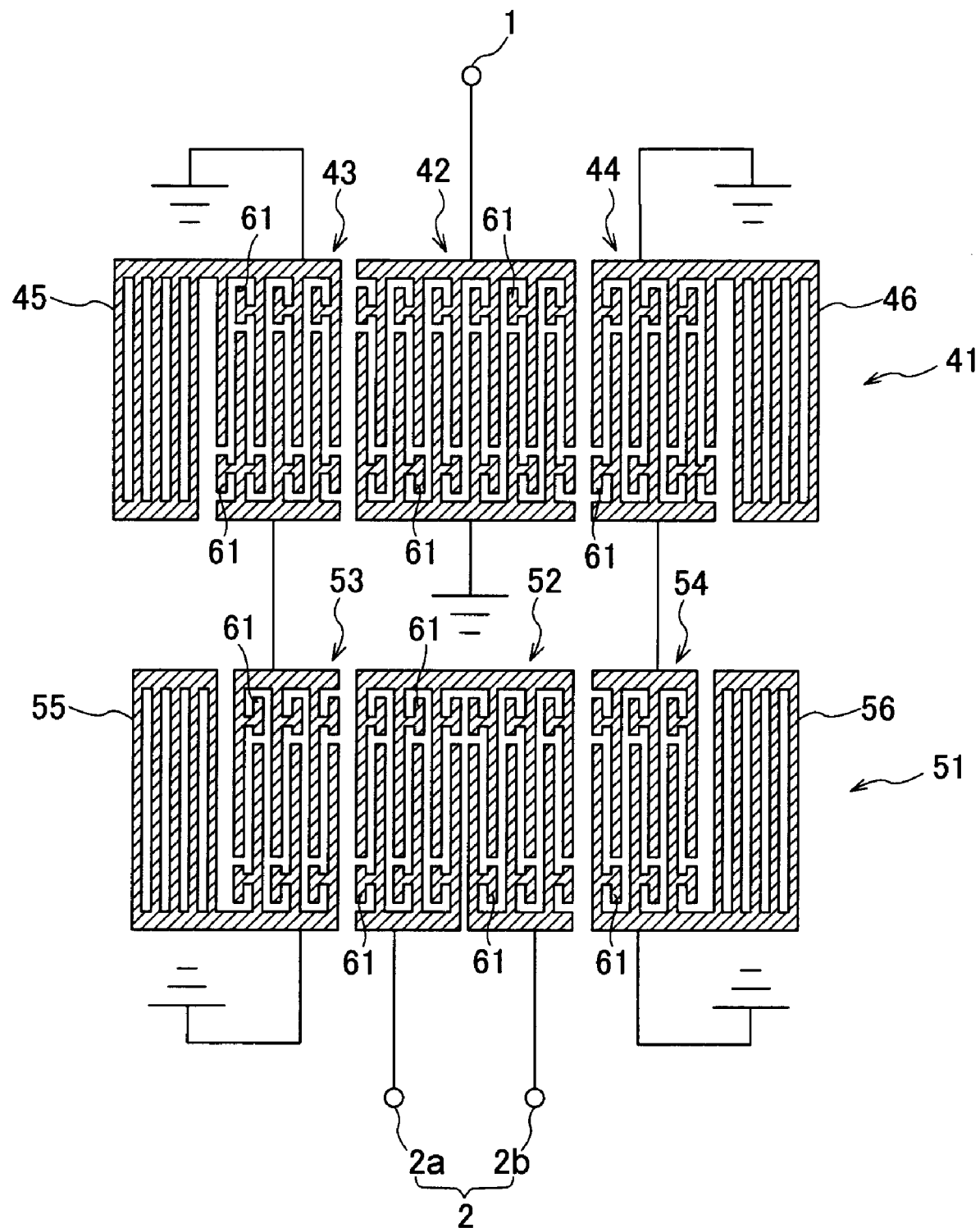
FIG. 12 is a diagram showing a longitudinally coupled multi-mode SAW filter according to a second embodiment of the present invention.
Figure 13:
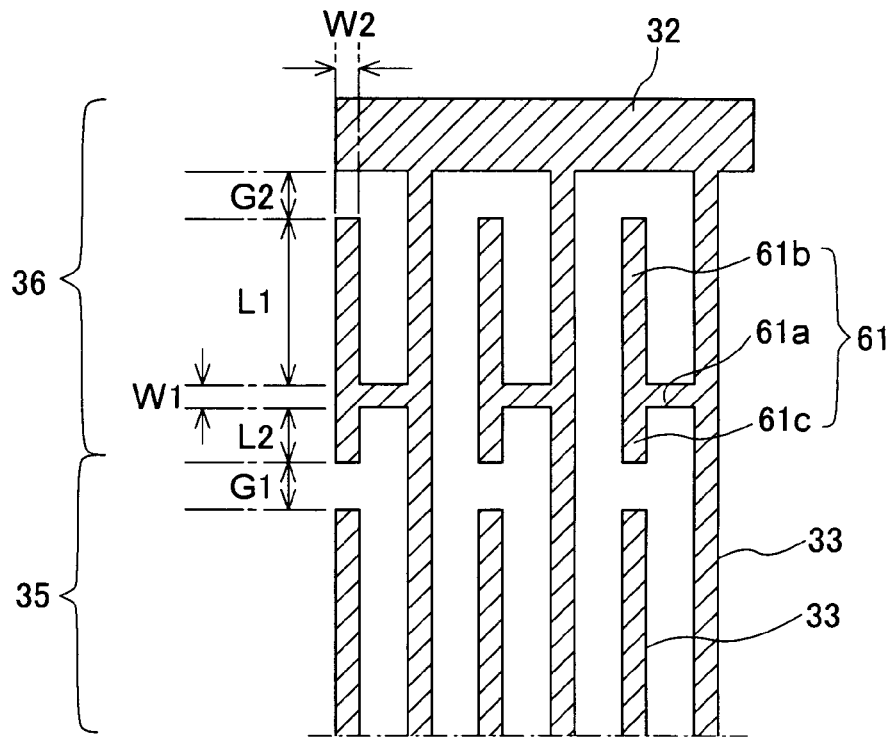
FIG. 13 is a diagram showing in an enlarged view an electrode non-overlap zone of IDT of the filter according to the second embodiment.

FIGS. 12 and 13 shows a longitudinally coupled multi-mode SAW filter according to a second embodiment. As shown in these figures, this SAW filter is similar to the filter of the first embodiment in that two longitudinally coupled multi-mode SAW filters 41, 51 are connected in series between an input terminal 1 and an output terminal 2. The configuration of IDTs 42, 43, 44, 52, 53, 54 and reflectors 45, 46, 55, 56 of each filter 41, 51, and the input/output terminals 1, 2 are basically the same as the first embodiment. While a branch electrode 61 is provided in a non-overlap zone 36 of the electrode of each IDTs 42-44, 52-54, the shape of these branch electrodes 61 is different from that in the first embodiment.

Specifically, in the first embodiment, the branch body 31b extends substantially in parallel with the interdigital electrode 33 from the leading end of the branch portion 31a toward the bus bar 32, and the branch electrode 31 generally has an L-shape, whereas in this embodiment, the branch body comprises a first branch body 61b which bends substantially at right angles from the leading end of a branch portion 61a and extends in a direction toward a bus bar 32, and a second branch body 61c which bend substantially at right angles from the leading end of the branch portion 61a in the opposite direction and extending in a direction toward an opposing comb-shaped electrode (leading end of the interdigital electrode 33), and generally has a T-shape. In other words, the branch portion 61a is connected to an intermediate portion of the branch electrode body (portion between one end and the other end of the branch electrode body) which extends substantially in parallel with the interdigital electrode 33 (in a direction substantially orthogonal to the propagation direction of surface acoustic waves). In this regard, the leading ends of the first and second branch bodies 61b, 61c are electrically open without being connected to the bus bar 32 or another electrode.

Figure 14:
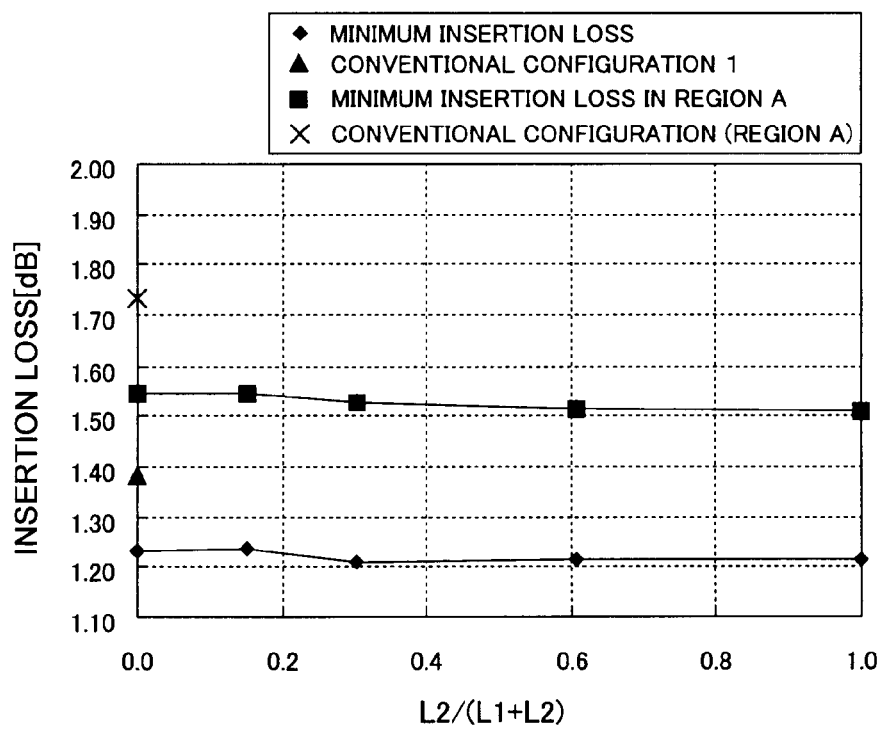
FIG. 14 is a graph showing a change in insertion loss when a length L1 of a first branch body and a length L2 of a second branch body are changed in the filter according to the second embodiment.

FIG. 14 shows an insertion loss when the length L1 of the first branch body 61b and the length L2 of the second branch body 61c are changed in the filter of this embodiment. Specifically, with the length of the overall branch bodies (L1+L2) being fixed at 3.3 μm, the length L2 of the second branch electrode body 61c was set at 0 μm, 0.5 μm, 1.0 μm, 2.0 μm, and 3.3 μm, and a relationship between the ratio L2/(L1+L2) of the length L2 of the second branch body 61c to the length (L1+L2) of the overall branch bodies (=0, 0.15, 0.3, 0.61, 1) and the insertion loss was found. Other parameters W1, W2, G1 and G2 are the same as that in the aforementioned first embodiment.

As is apparent from this result, when the total length of L1 and L2 is fixed, a change in the ratio [L2/(L1+L2)] results in improvements in insertion loss as compared with the conventional configuration 1 in all cases, and it is understood that particularly, $0.3 \leq L2/(L1+L2) \leq 1$ is preferable.

Third Embodiment

Figure 15:
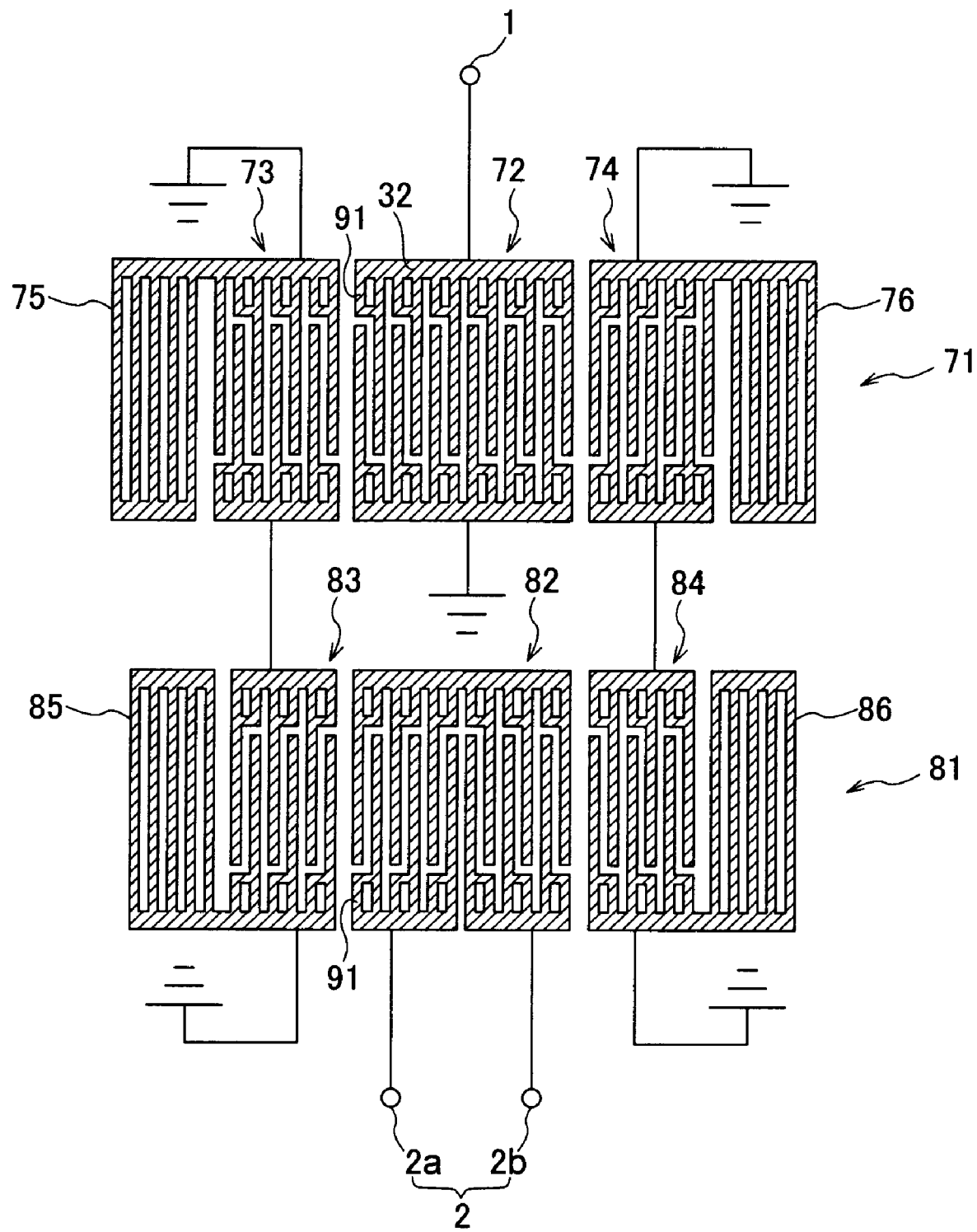
FIG. 15 is a diagram showing a longitudinally coupled multi-mode SAW filter according to a third embodiment of the present invention.

FIG. 15 shows a longitudinally coupled multi-mode SAW filter according to a third embodiment of the present invention. As shown in FIG. 15, this SAW filter is similar to the filters of the first and second embodiments in that two longitudinally coupled multi-mode SAW filters 71, 81 are connected in series between an input terminal 1 and an output terminal 2. While the configuration of IDTs 72, 73, 74, 82, 84 and reflectors 75, 76, 85, 86 of each filter 71, 81, and the input/output terminals 1, 2 are basically the same as the first embodiment, the shape of branch electrodes 91 is different from that in the aforementioned embodiment.

Specifically, in the first and second embodiments, the leading end of the branch electrode is electrically left open, whereas in this embodiment, the leading end of the L-shaped branch electrode 91 in the first embodiment (leading end of the branch body) is connected to the bus bar 32 to electrically short-circuit the leading end of the branch electrode 91.

Figure 16:
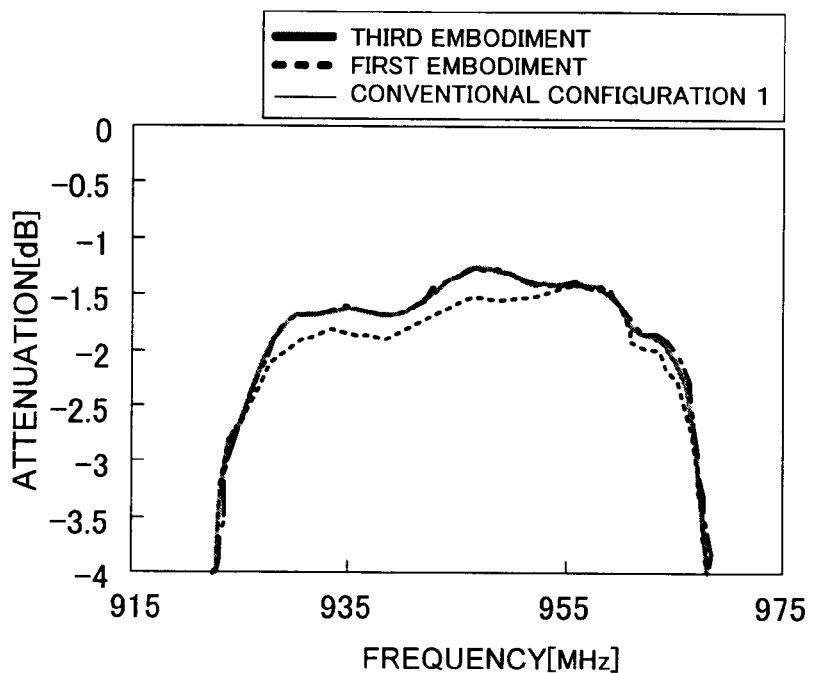
FIG. 16 is a graph showing the frequency characteristic in a pass band of the filter according the third embodiment in comparison with the first embodiment and a filter of a conventional structure.
Figure 17:
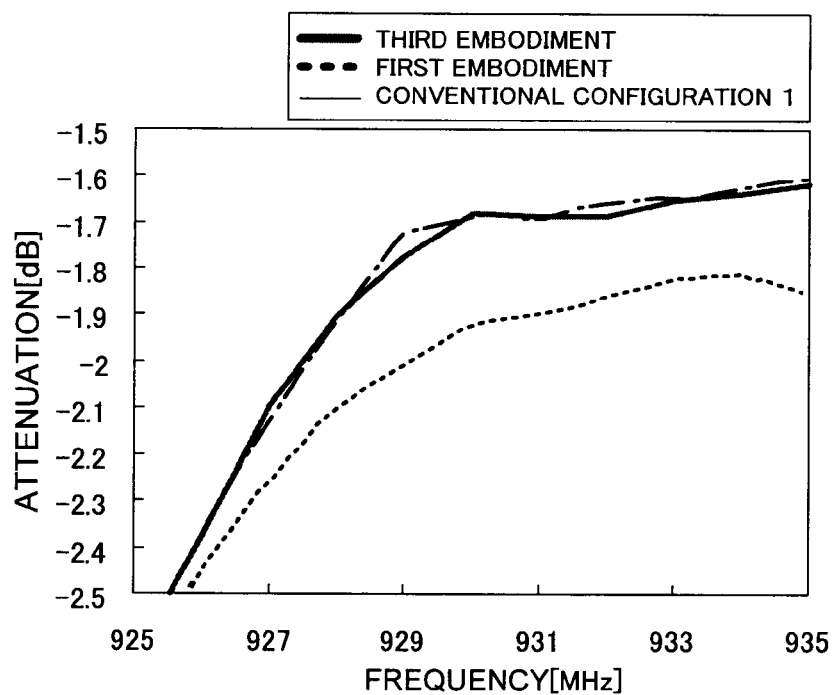
FIG. 17 is a graph showing in an enlarged view the lower side of the pass band in FIG. 16.

FIG. 16 shows the frequency characteristic in the pass band of the filter according to this embodiment, together with the first embodiment and conventional configuration 1, and FIG. 17 is an enlarged view of the lower side of the pass band in FIG. 16. As can be seen from these figures, while the first embodiment provides slightly better characteristics in both the regions A and B, this embodiment can also realize an improvement effect substantially similar to the first embodiment.

Considering in this regard, in this embodiment, electric potential distributions of adjacent electrodes substantially match because the bus bar 32 and the leading end of the branch electrode 91 are short-circuited. On the other hand, in the filter structure of the first embodiment, the branch bodies exist through the interdigital electrodes and the branch portions of branch electrodes which extend therefrom, and their leading ends are open, so that the electric potential distributions of adjacent electrodes are not completely the same. From this fact, it is thought that the structure of the first embodiment provides better characteristics than the structure of this embodiment.

Further, as an exemplary modification to this embodiment, an electrode structure may be an appropriate mixture of the branch electrode structure of the first embodiment (the L-shaped branch electrode 31 having an open leading end) with the branch electrode structure of this embodiment (the branch electrode 91 having the leading end short-circuited to the bus bar) such as some of multiple branch electrodes provided in this embodiment being short-circuited with the rest being open, or the like. It is also possible to partially mix the branch electrode structure of the second embodiment (the T-shaped branch electrode 61 having an open leading end).

Fourth Embodiment

Figure 18:
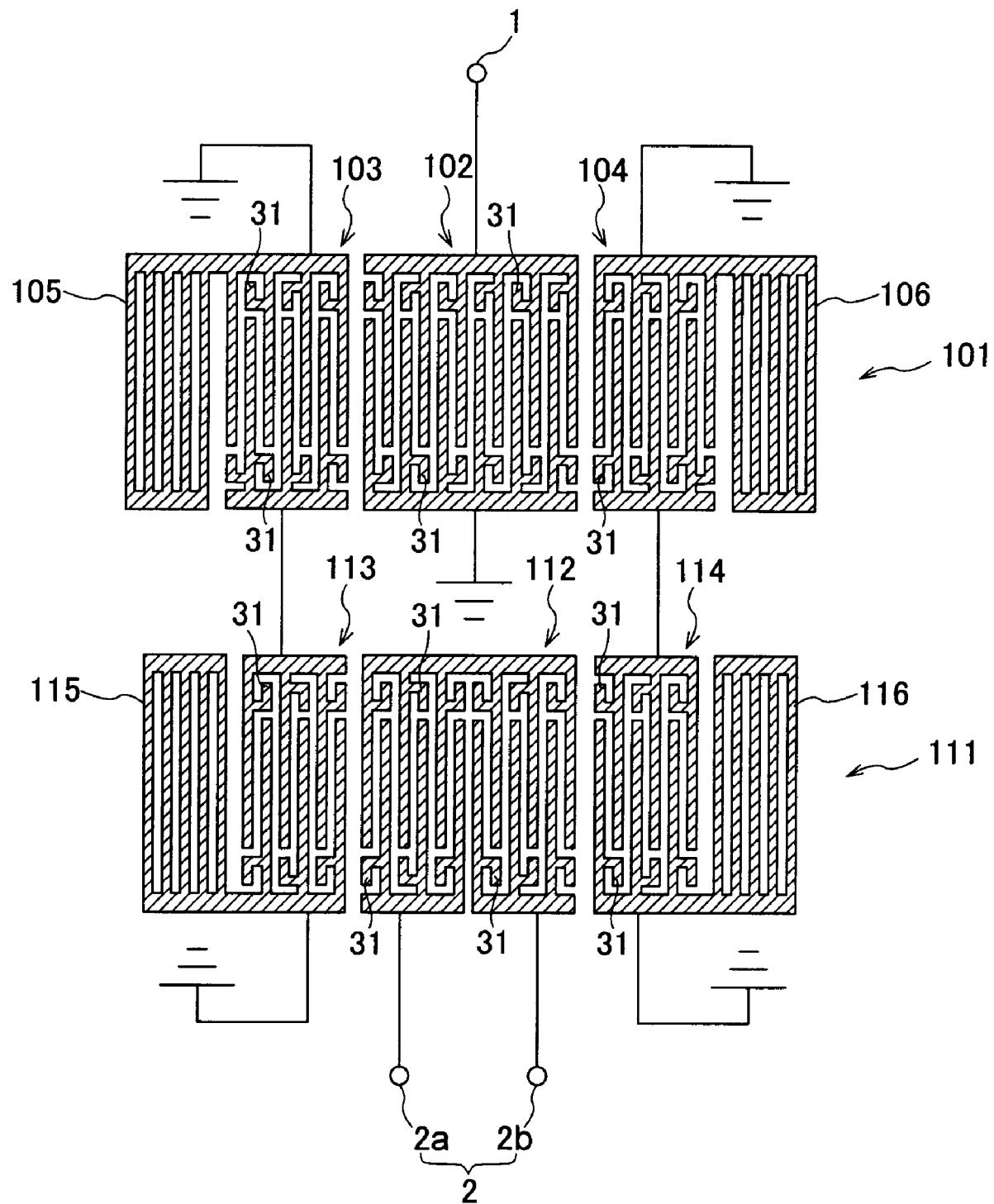
FIG. 18 is a diagram showing a longitudinally coupled multi-mode SAW filter according to a fourth embodiment of the present invention.

FIG. 18 shows a longitudinally coupled multi-mode SAW filter according to a fourth embodiment of the present invention. As shown in FIG. 18, this SAW filter is similar to the first embodiment in that two longitudinally coupled multi-mode SAW filters 101, 111 are connected in series between an input terminal 1 and an output terminal 2, and L-shaped branch electrodes 31 are provided in electrode non-overlap zones of IDTs 102, 103, 104, 112, 113, 114 which form part of each filter 101, 111. However, in the first embodiment, the branch bodies 31b are all extended in the direction toward the bus bars 32, whereas in this embodiment, those similar to the first embodiment which extend toward the bus bars 32 and those which extend toward opposing comb-shaped electrode, in the opposite direction, are alternately disposed.

Figure 19:
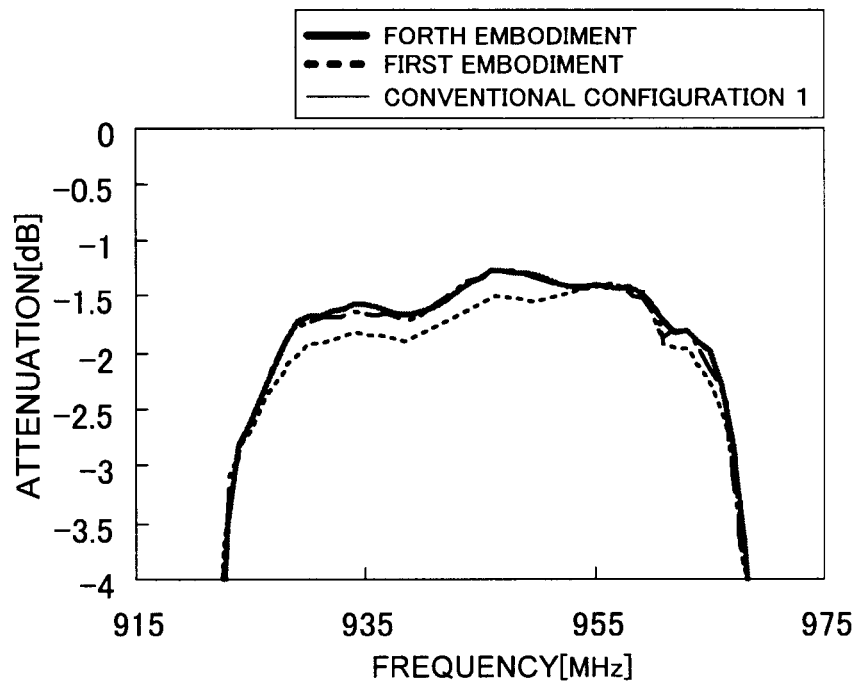
FIG. 19 is a graph showing the frequency characteristic in a pass band of the filter according to the fourth embodiment in comparison with the first embodiment and a filter of a conventional structure.

FIG. 19 shows the frequency characteristic in the pass band of the filter according to this embodiment, together with the first embodiment and conventional configuration 1. As is apparent from this figure, an improvement effect similar to (or slightly better than) the first embodiment can be produced by the filter structure of this embodiment.

Fifth Embodiment

A filter structure for reducing an electrode resistance by connecting two multi-mode filters in parallel in order to reduce a loss and reducing the length of electrodes of IDTs is known. This embodiment applies the present invention to such a filter structure.

Figure 20:
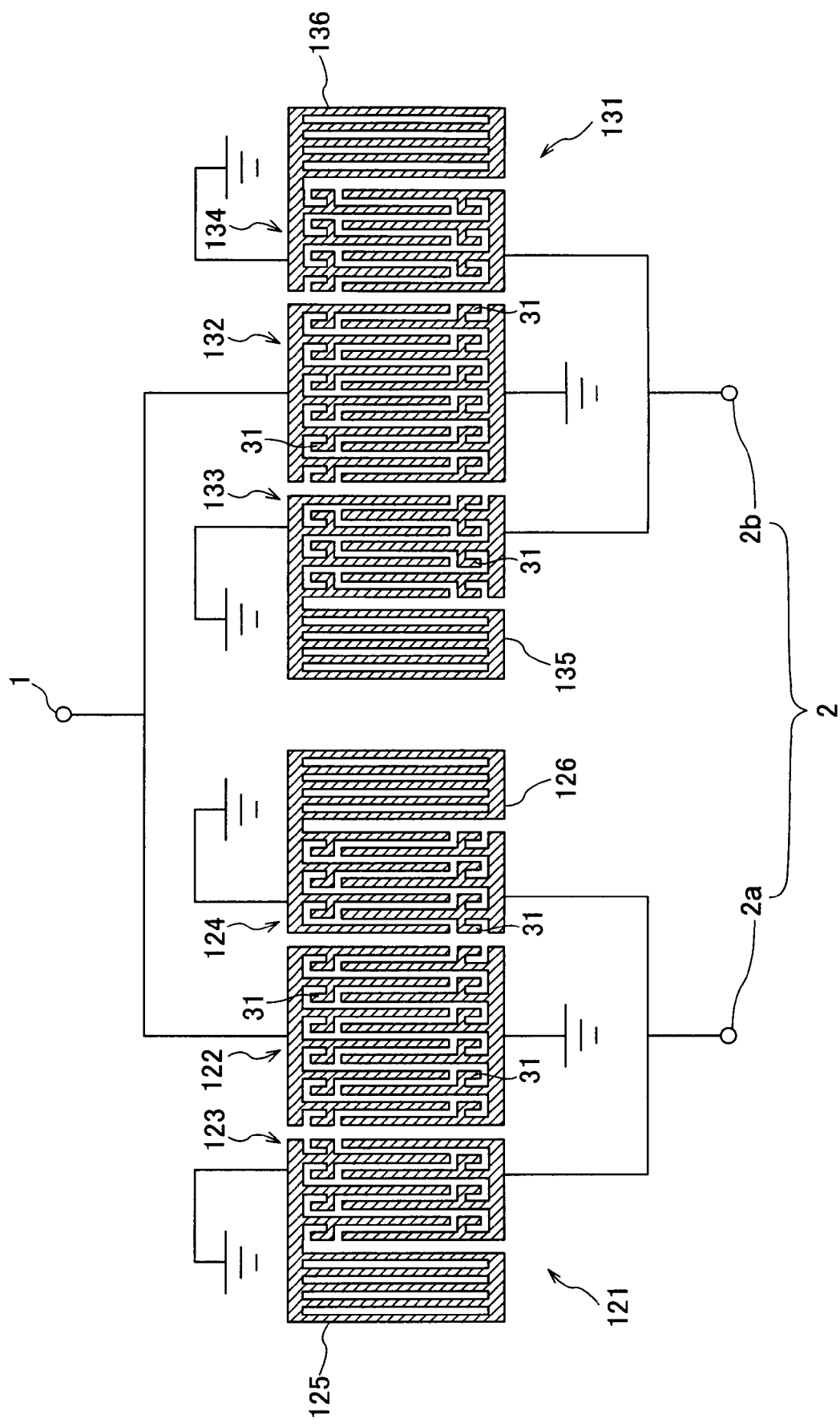
FIG. 20 is a diagram showing a longitudinally coupled multi-mode SAW filter according to a fifth embodiment of the present invention.

Specifically, FIG. 20 shows a longitudinally coupled multi-mode SAW filter according to a fifth embodiment of the present invention. As shown in FIG. 20, this filter comprises two longitudinally coupled multi-mode filters 121, 131 connected in parallel between an input terminal 1 and an output terminal 2. Each filter 121, 131 comprises, like the filter of the first embodiment, reflectors 125, 126, 135, 136 on both sides of three IDTs 122, 123, 124, 132, 133, 134, and an L-shaped branch electrode 31 extending from the interdigital electrode is provided in an electrode non-overlap zone of each IDT 122-124, 132-134. It should be noted that the output terminal 2 is made to be a balanced output terminal by changing the phase of one of the parallelly connected filters 121, 131 approximately by 180° with respect to the other filter.

The filter of this embodiment assumes a receiving filter in a PCS band (the center frequency of which is 1960 MHz), and detailed specifications can be, for example, as follows.

As a piezo-electric substrate, a 42±6° Y-cut X-propagation LT substrate which has undergone pyro-electric property improvement processing by adding an additive (for example Fe) is used. The electrodes of each IDT 122-124, 132-134 and the reflectors 125, 126, 135, 136 are made, for example, of an Al single crystal film, and have a thickness of approximately 169 nm by way of example. Also, in this event, as an underlying layer, a TiN film having a thickness of 4 nm, by way of example, is formed in order to facilitate the single crystallization. For the fabrication, a pattern of each SAW filter is formed on the surface of the piezo-electric substrate using a known photolithography (photo-etching) technique, singulated into individual pieces by dicing, mounted on a ceramic substrate by flip-chip bonding, and encapsulated with a resin.

Dimensions of each portion and the number of electrodes of each DMS filter 121, 131 are, for example, as follows:
Average Electrode Period $\lambda$ of IDT Electrodes: 2.024 μm
Average Electrode Pitch p of IDT Electrodes: 1.012 μm
Electrode Pitch of Reflector: 1.012 μm
Number of Electrode Pairs of IDTs: 41 pairs in the central IDTs 122, 132, and 18.5 pairs in the outside IDTs 123, 124, 133, 134
Number of Electrodes of Reflector: 65
Overlap Length (Length of Overlap Zone of Electrodes): 42$\lambda$
Distance between IDT and Reflector: 0.5$\lambda$
DUTY: 0.62 for Both IDT and Reflector Like the first embodiment, narrow-pitch electrodes are provided in the IDT of this embodiment as well. Also, the other filter has balanced outputs 2a, 2b by changing the phases of two IDTs at both outer sides.

Dimensions of each portion of the branch electrode 31 are, for example, as follows:
Width W1 of Branch Portion: 0.5 μm (=0.25$\lambda$)
Width W2 of Branch Body: Same as Interdigital Electrode
Gap G1 between Leading End of Interdigital Electrode and Branch Electrode: 0.45 μm (=0.22$\lambda$)
Length L1 of Branch Body: 2.0 μm (=0.99$\lambda$)
Gap G2 between Leading End of Branch Body and Bus Bar: 0.45 μm (=0.22$\lambda$)

Figure 21:
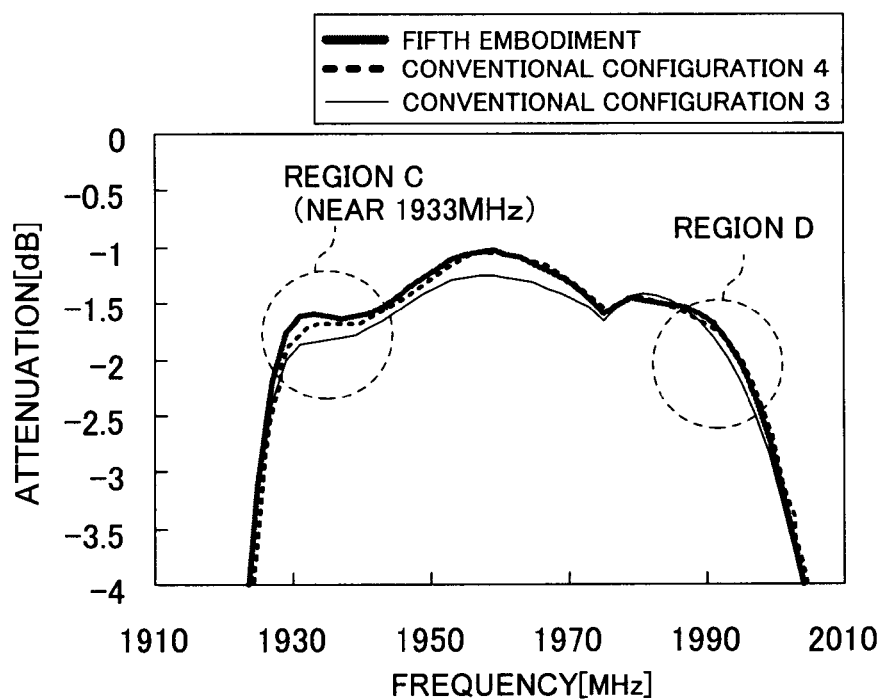
FIG. 21 is a graph showing the frequency characteristic in a pass band of the filter according to the fifth embodiment in comparison with a filter of a conventional structure.

FIG. 21 shows the frequency characteristic in the pass band of the filter according to this embodiment in comparison with the characteristic of a filter having a parallel connection structure similar to the conventional one (conventional configuration 3 and conventional configuration 4). In this regard, the conventional configuration 3 comprises two multi-mode filters connected in parallel in a manner similar to the filter of the embodiment shown in FIG. 20 (the filter 201 at the first stage in FIG. 34 is connected in parallel with a filter having a phase of this filter substantially by 180°, and specifications of each portion of IDT and reflector (the number of electrodes, electrode period, electrode pitch, overlap length, dimensions and the like) are the same as the fifth embodiment), and no branch electrode is provided in any of each IDT. On the other hand, the conventional structure 4 comprises two multi-mode filters connected in parallel in a similar manner, but no branch electrode is provided in any of each IDT, and the bus bar is processed as in the conventional configuration 2 shown in FIG. 35 (conductive portions and non-conductive portions are provided in the bus bar).

As can be seen from FIG. 21, the filter structure of this embodiment can also reduce the insertion loss in the pass band, and provides a good loss improvement effect particularly in a lower region C and a higher region D of the pass band. Specifically, the improvement effect as compared with the conventional configuration 3 is approximately 0.23 dB in the lower side of the pass band, and an improvement of 0.07 dB was able to be confirmed on the lower side of the pass band even in comparison with the conventional configuration 4. It is thought that a further reduction in loss was achieved because the velocity of SAW can be reduced in a portion closer to the electrode overlap zone of the IDT as is the case with each of the aforementioned embodiments.

Figure 22:
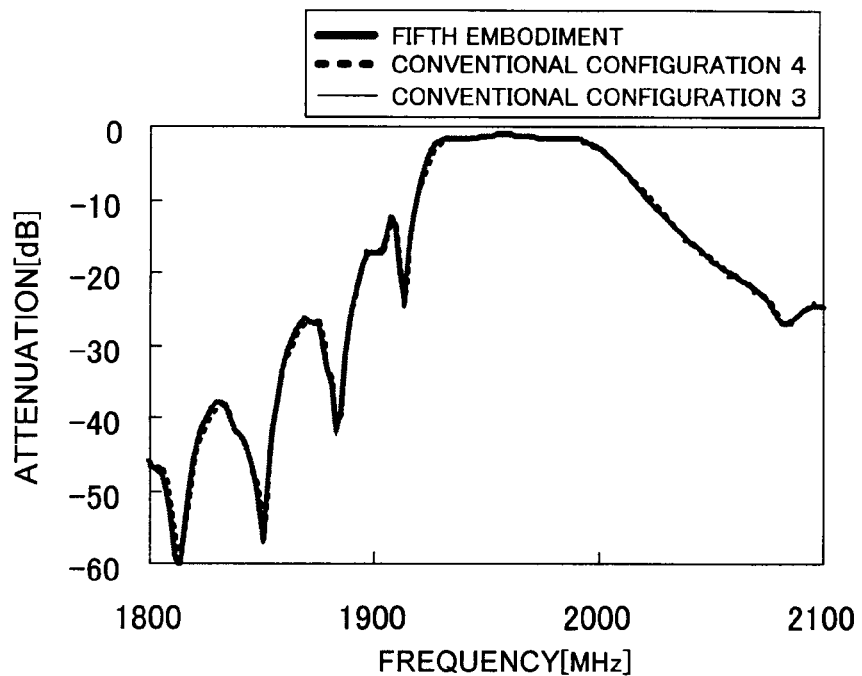
FIG. 22 is a graph showing the frequency characteristic out of the pass band of the filter according to the fifth embodiment in comparison with a filter of a conventional structure.

FIG. 22 further shows the result of measuring the frequency characteristic out of the pass band, and this embodiment shows substantially the same characteristic as the conventional configurations 3, 4, from which it is understood that the characteristic out of the pass band is not affected even if the structure of this embodiment is employed.

Figure 23:
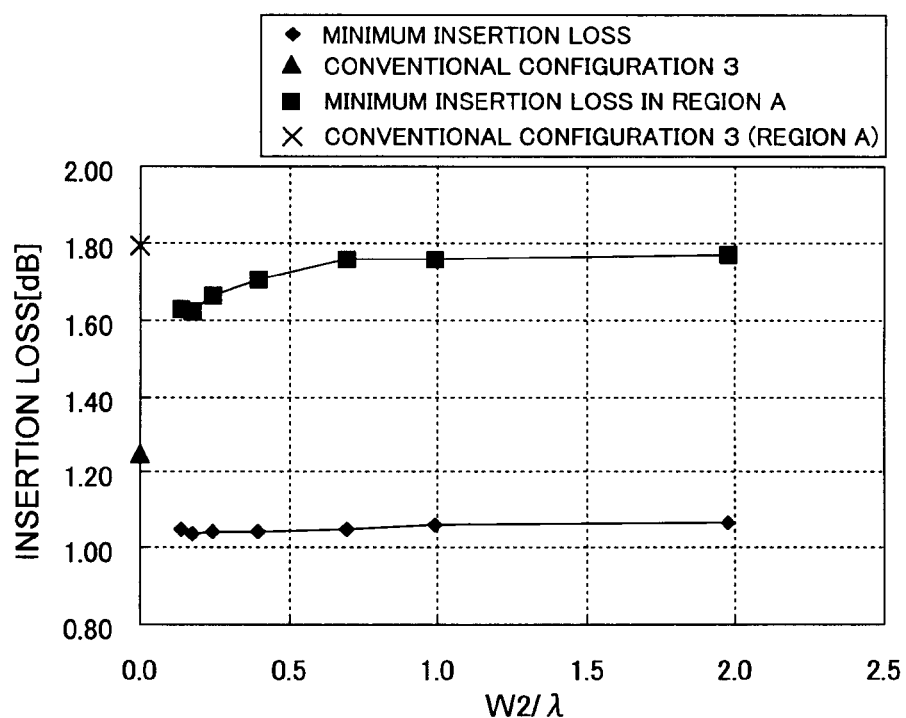
FIG. 23 is a graph showing a change in insertion loss when a width W1 of a branch portion of a branch electrode in the fifth embodiment.

FIG. 23 shows a change in insertion loss when the width W1 of the branch portion of the branch electrode is varied in this embodiment, specifically when W1=0.27 μm (0.13λ), 0.35 μm (0.17λ), 0.5 μm (0.25λ), 0.8 μm (0.40λ), 1.4 μm (0.69λ), 2.0 μm (0.99λ), and 4.0 μm (1.98λ), in comparison with the conventional configuration 3. As is apparent from this figure, any structure according to the present invention provides a good insertion loss reduction effect as compared with the conventional configuration 3. Accordingly, at least 0.13λ≦W1≦1.98λ is preferable from a viewpoint of providing a good loss improvement effect.

Sixth Embodiment

Figure 24:
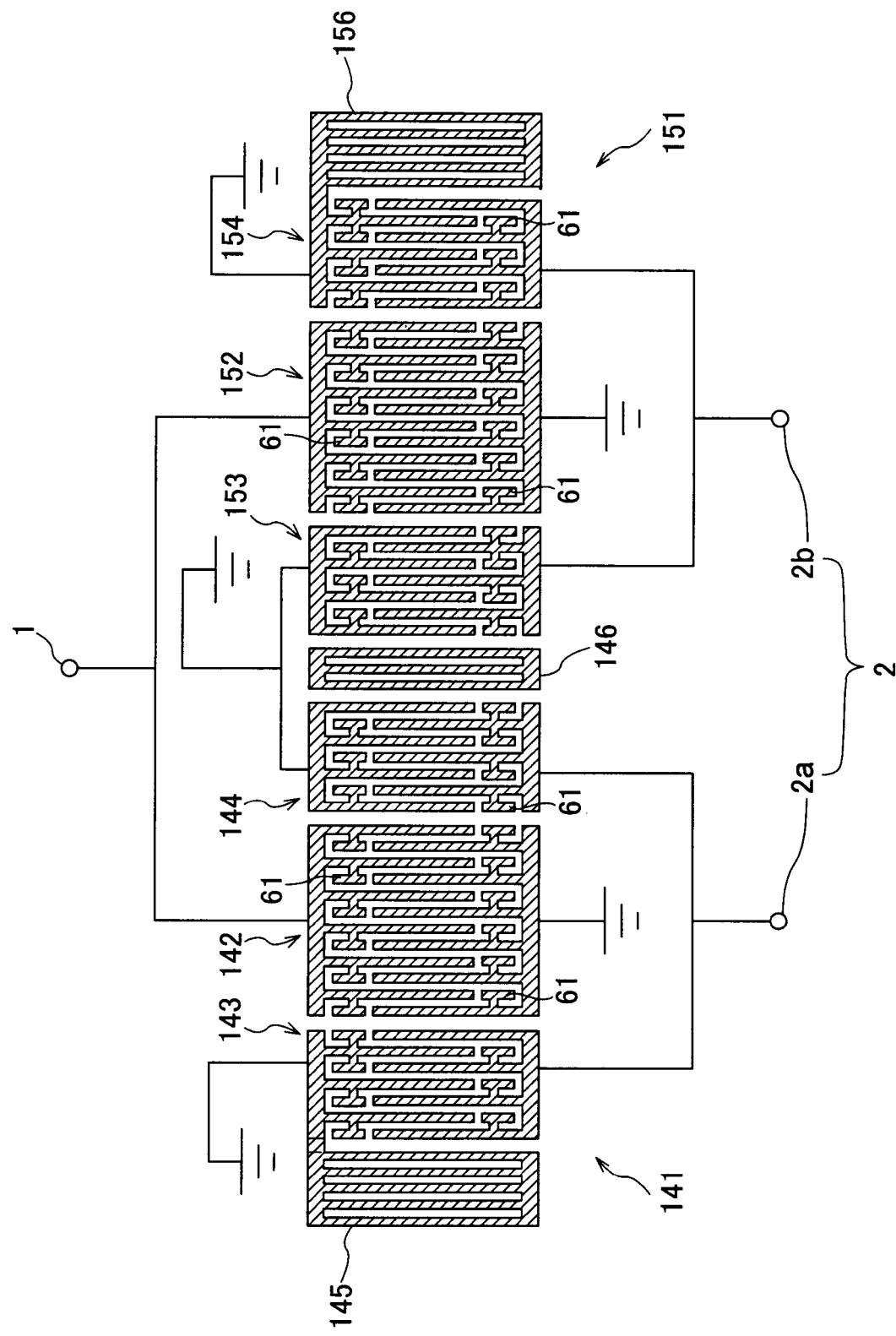
FIG. 24 is a diagram showing a longitudinally coupled multi-mode SAW filter according to a sixth embodiment of the present invention.

FIG. 24 shows a longitudinally coupled multi-mode SAW filter according to a sixth embodiment of the present invention. As shown in FIG. 24, this SAW filter is similar to the fifth embodiment in that two longitudinally coupled multi-mode filters 141, 151 are connected in parallel between an input terminal 1 and an output terminal 2. Each filter 141, 151 are similar to the filter of the second embodiment in that it comprises three IDTs 142, 143, 144, 152, 153, 154, and a T-shaped branch electrode 61 extending from an interdigital electrode 33 is provided in an electrode non-overlap zone of each IDT 142-144, 152-154.

In this embodiment, however, reflectors 145, 156 are provided outside the two filters 141, 151, respectively, and a reflector 146 comprising several electrode columns is provided between both filters 141, 151 to acoustically couple both filters 141, 151. In this regard, the reflector 146 interposed between both filters 141, 151 can be omitted.

Seventh Embodiment

Figure 25:
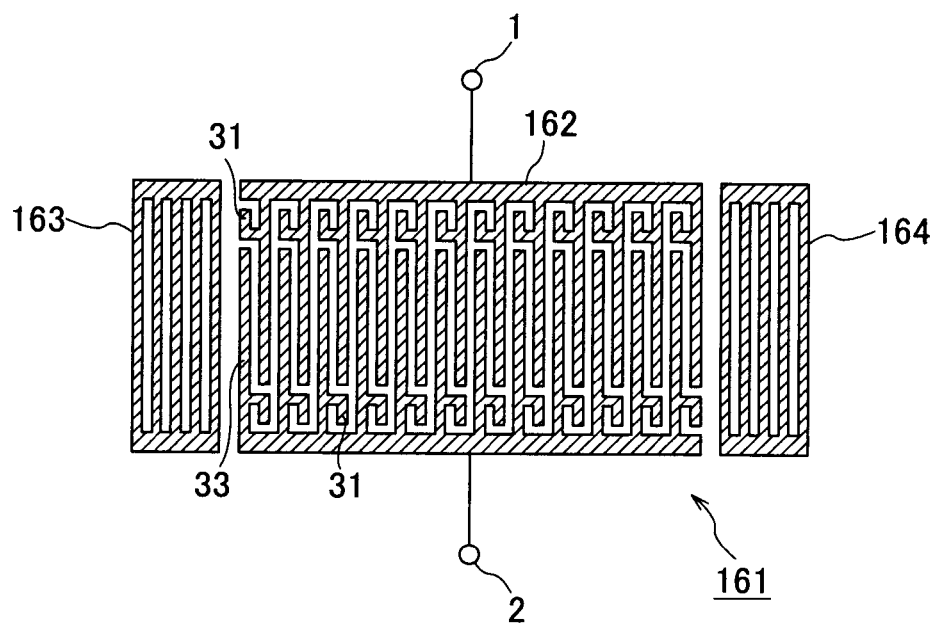
FIG. 25 is a diagram showing a SAW resonator according to a seventh embodiment of the present invention.

FIG. 25 shows a SAW resonator according to a seventh embodiment of the present invention. As shown in FIG. 25, this SAW resonator 161 comprises reflectors 163, 164 disposed on both sides of a single IDT 162, and an L-shaped branch electrode 31 is provided at the proximal end of each interdigital electrode 33 of the IDT 162 in a manner similar to the first embodiment. It should be noted that the reflectors 163, 164 disposed on both sides of the IDT 162 can be omitted when the IDT 162 is a so-called multi-electrode pair resonator. As a specific example of the configuration of each portion of this embodiment, the following configuration can be employed, by way of example.

As a piezo-electric substrate, a 42±6° Y-cut X-propagation LT substrate which has undergone pyro-electric property improvement processing by adding an additive (for example Fe) is used. The electrodes of the IDT 162 and the reflectors 163, 164 are made, for example, of an Al single crystal film, and have a thickness of approximately 169 nm by way of example, and, as an underlying layer, a TiN film having a thickness of 4 nm, by way of example, is formed in order to facilitate the single crystallization.

Dimensions of each portion and the number of electrodes of the IDT 162 and reflectors 163, 164 are, for example, as follows:
Electrode Period λ of IDT and Reflector: 1.968 μm
Electrode Pitch p of IDT and Reflector: 0.984 μm
Overlap Length (Length of Overlap Zone of Electrodes): 30λ
Number of Electrode Pairs of IDTs: 159 pairs
Number of Electrodes of Reflector: 80
Distance between IDT and Reflector: 0.5λ
DUTY: 0.62
Dimensions of each portion of the branch electrode 31 are, for example, as follows:
Width W1 of Branch Portion: 0.63 μm (=0.32λ)
Width W2 of Branch Body: Same as Interdigital Electrode
Gap G1 between Leading End of Interdigital Electrode and Branch Electrode: 0.5 μm (=0.25λ)
Length L1 of Branch Body: 2.0 μm (=1.02λ)
Gap G2 between Leading End of Branch Body and Bus Bar: 0.5 μm (=0.25λ)

Figure 26:
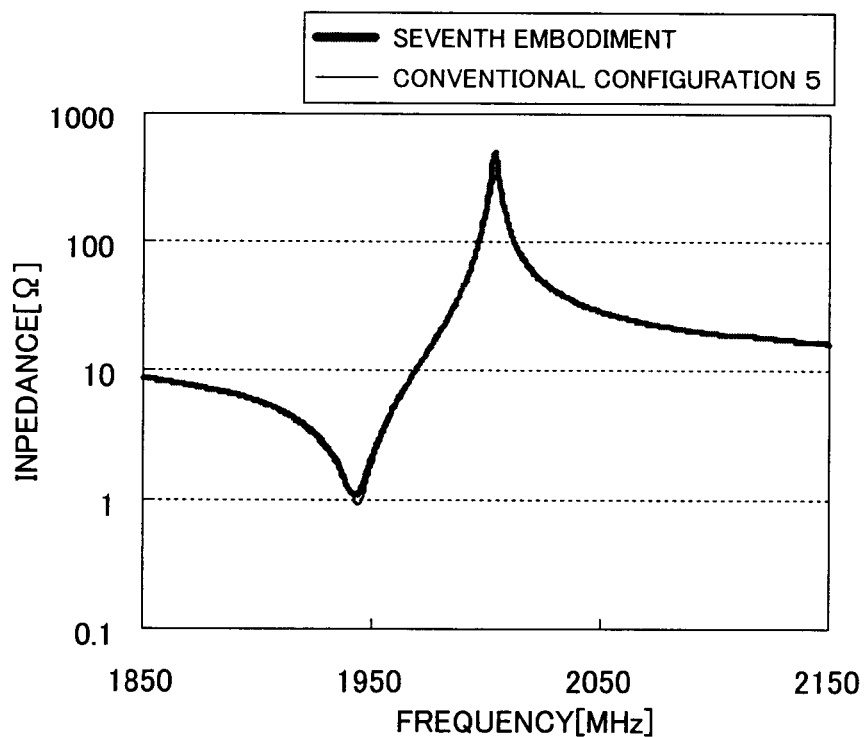
FIG. 26 is a graph showing the frequency-impedance characteristic of the SAW resonator according to the seventh embodiment.
Figure 27:
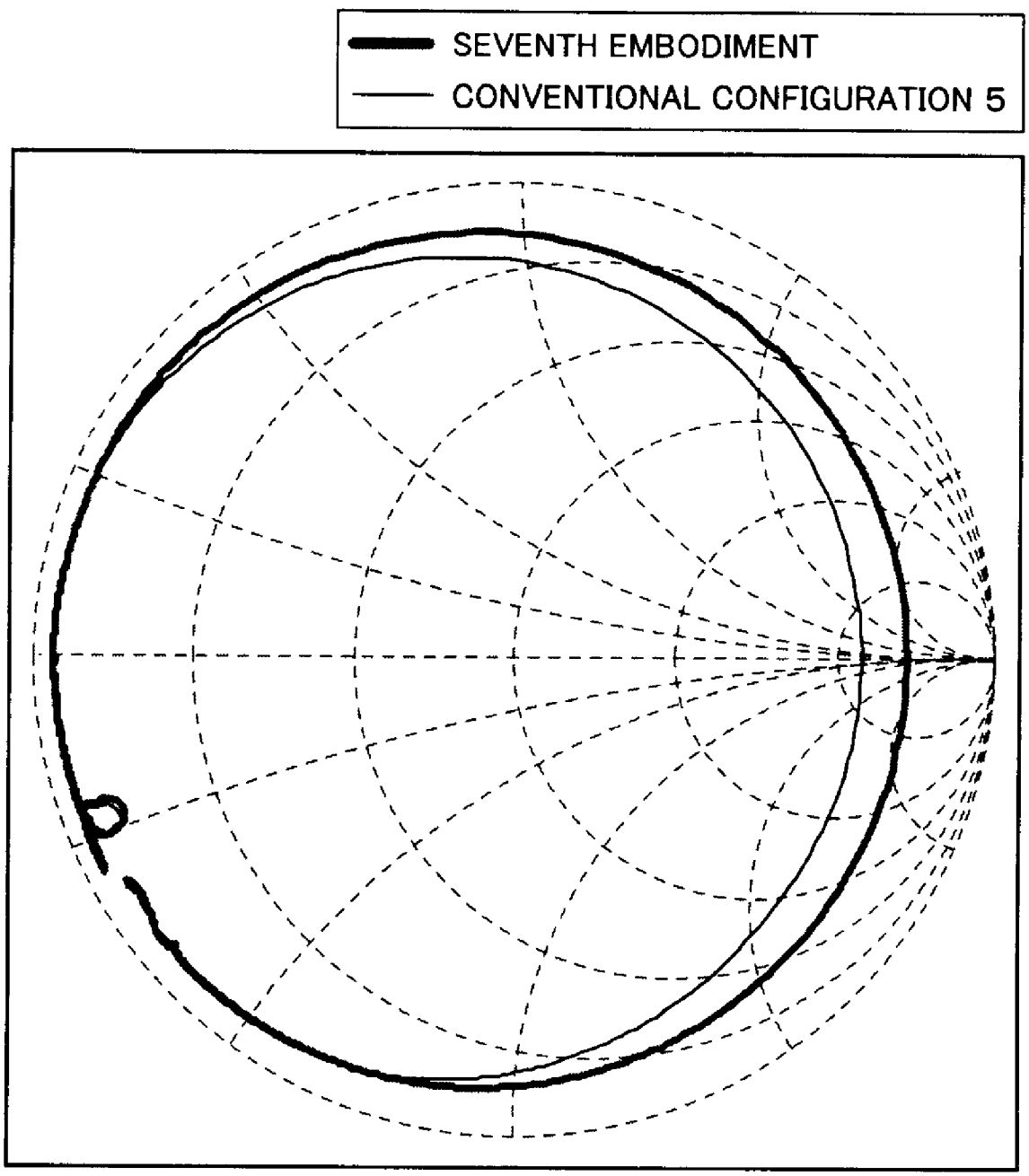
FIG. 27 is a Smith chart showing the characteristic of the SAW resonator according to the seventh embodiment.

A resonator having such specifications was fabricated, and the frequency-impedance characteristic was measured. FIGS. 26 and 27 show the result in comparison with the conventional configuration 5 (reflectors are provided on both sides of the IDT, but no branch electrode is provide) having a similar structure. As is apparent from these figures, it is understood that the Q-value of resonance (the ratio of impedance at the resonance frequency to impedance at the anti-resonant frequency) can be improved by applying the present invention to the resonator which comprises the reflectors on both sides of the IDT (an improvement of 2.9 dB can be achieved from 50.4 dB to 53.3 dB).

Eighth Embodiment

Figure 28:
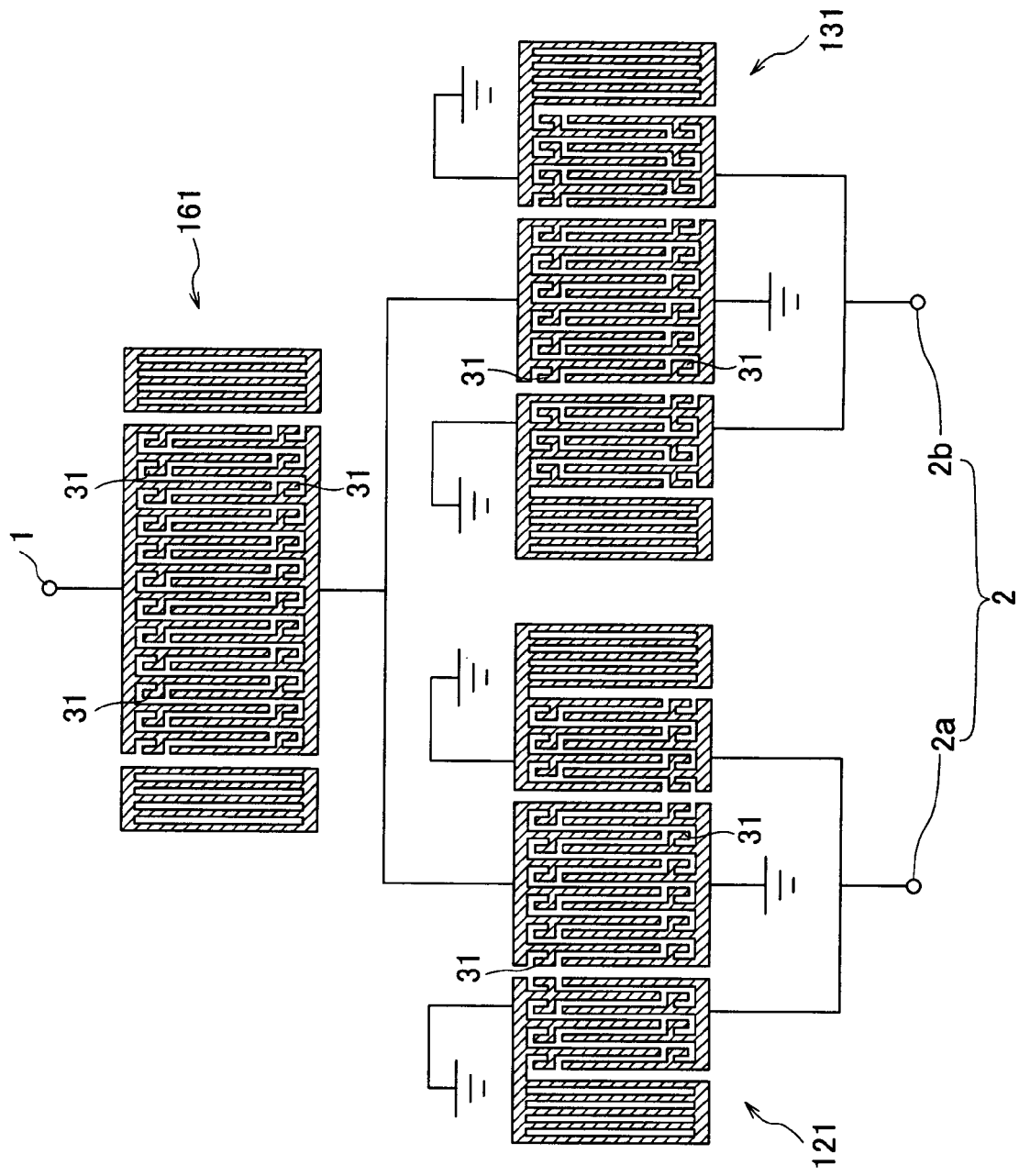
FIG. 28 is a diagram showing a longitudinally coupled multi-mode SAW filter according to an eighth embodiment of the present invention.

FIG. 28 shows a longitudinally coupled multi-mode SAW filter according to an eighth embodiment of the present invention. As shown in FIG. 28, this SAW filter is such that a SAW resonator 161 is connected in series between the longitudinally coupled multi-mode filters 121, 131 connected in parallel and the unbalanced input terminal 1 in the longitudinally coupled multi-mode SAW filter according to the fifth embodiment. As the SAW resonator 161, a resonator having the structure of the seventh embodiment comprising branch electrodes in the IDT is used. Also, for the two filters 121, 131 connected in parallel, an L-shaped branch electrode extending from the interdigital electrode is provided in an electrode non-overlap zone of the IDTs which form part of them.

Figure 29:
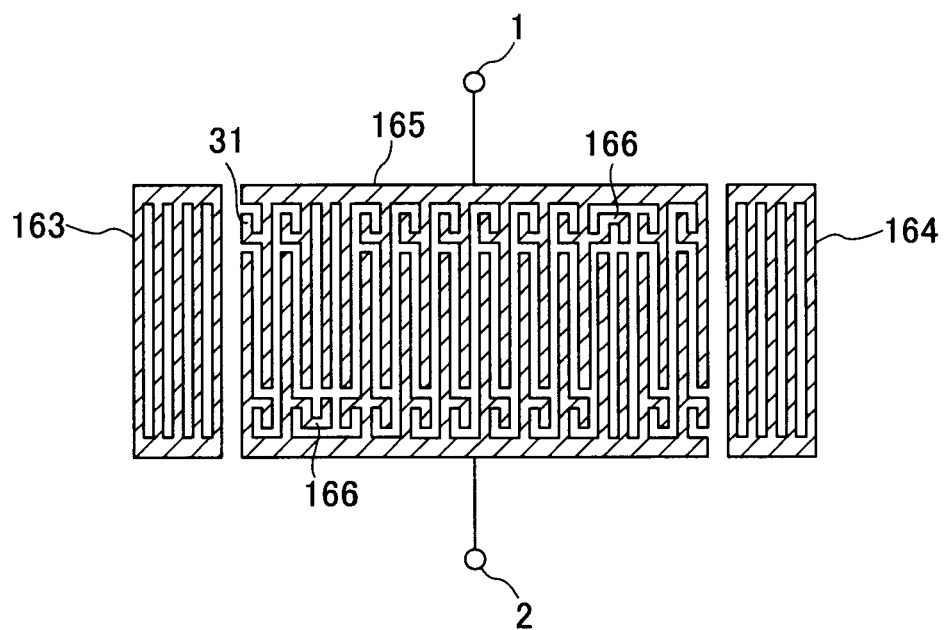
FIG. 29 is a diagram showing another example of a SAW resonator which can be used in the longitudinally coupled multi-mode SAW filter according to the eighth embodiment.

The resonator 161 may be a multiple pair resonator. Also, as shown in FIG. 29, interdigital electrodes of the IDT 165 which forms part of the resonator may not be alternately crossed, but an electrode from one comb-shaped electrode may have a continuous portion (dummy electrodes may be disposed after parts of electrodes are so-called thinned out). In this event, a branch electrode 166 which is further extended from the leading end of the L-shaped branch electrode and routed, for example, in a hook shape can be provided in the electrode non-overlap zone of the continuous portion.

The filter of this embodiment assumes a receiving filter in a DCS band (the center frequency of which is 1842.5 MHz), and detailed specifications can be, for example, as follows.

As a piezo-electric substrate, a 42±6° Y-cut X-propagation LT substrate which has undergone pyro-electric property improvement processing by adding an additive (for example Fe) is used. The electrodes of each IDT and reflector are made, for example, of an Al single crystal film, and have a thickness of approximately 169 nm by way of example. Also, as an underlying layer, a TiN film having a thickness of 4 nm, by way of example, is formed in order to facilitate the single crystallization. For the fabrication, a pattern of each SAW filter 121, 131 and resonator 161 is formed on the surface of the piezo-electric substrate, singulated into individual pieces by dicing, mounted on a ceramic substrate by flip-chip bonding, and encapsulated with a resin.

Dimensions of each portion and the number of electrodes of each DMS filter 121, 131 are, for example, as follows:

Average Electrode Period λ of IDT Electrodes: 2.149 μm
Average Electrode Pitch p of IDT Electrodes: 1.0745 μm
Electrode Pitch of Reflector: 1.089 μm
Number of Electrode Pairs of IDTs: 24 pairs in the central IDT, and 12.5 pairs in the outside IDTs
Number of Electrodes of Reflector: 75
Overlap Length (Length of Overlap Zone of Electrodes): 44λ
Distance between IDT and Reflector: 0.5λ
DUTY: 0.64 for Both IDT and Reflector Like the fifth embodiment, narrow-pitch electrodes are provided in the IDT of this embodiment as well. Also, the output terminals are made to be a balanced output terminals 2a, 2b by changing the phase of one of the parallelly connected filters approximately by 180° with respect to the other filter (the phases of two IDTs on both sides are changed).

Dimensions of each portion of the branch electrode 31 in each filter 121, 131 are, for example, as follows:

Width W1 of Branch Portion: 0.6 μm (=0.28λ)
Width W2 of Branch Body: Same as Interdigital Electrode
Gap G1 between Leading End of Interdigital Electrode and Branch Electrode: 0.45 μm (=0.21λ)
Length L1 of Branch Body: 2.8 μm (=1.30λ)
Gap G2 between Leading End of Branch Body and Bus Bar: 0.45 μm (=0.21λ)

Dimensions of each portion and the number of electrodes of the IDT and reflector of the SAW resonator 161 are, for example, as follows:

Electrode Period λ of IDT and Reflector: 2.098 μm
Electrode Pitch p of IDT and Reflector: 1.049 μm
Overlap Length (Length of Overlap Zone of Electrodes): 21.6λ
Number of Electrode Pairs of IDTs: 160 pairs
Number of Electrodes of Reflector: 65
Distance between IDT and Reflector: 0.5λ
DUTY: 0.64

Dimensions of each portion of the branch electrode 31 of the SAW resonator 161 are, for example, as follows:

Width W1 of Branch Portion: 0.67 μm (=0.32λ)
Width W2 of Branch Body: Same as Interdigital Electrode
Gap G1 between Leading End of Interdigital Electrode and Branch Electrode: 0.7 μm (=0.33λ)
Length L1 of Branch Body: 2.8 μm (=1.33λ)
Gap G2 between Leading End of Branch Body and Bus Bar: 0.7 μm (=0.33λ)

Figure 30:
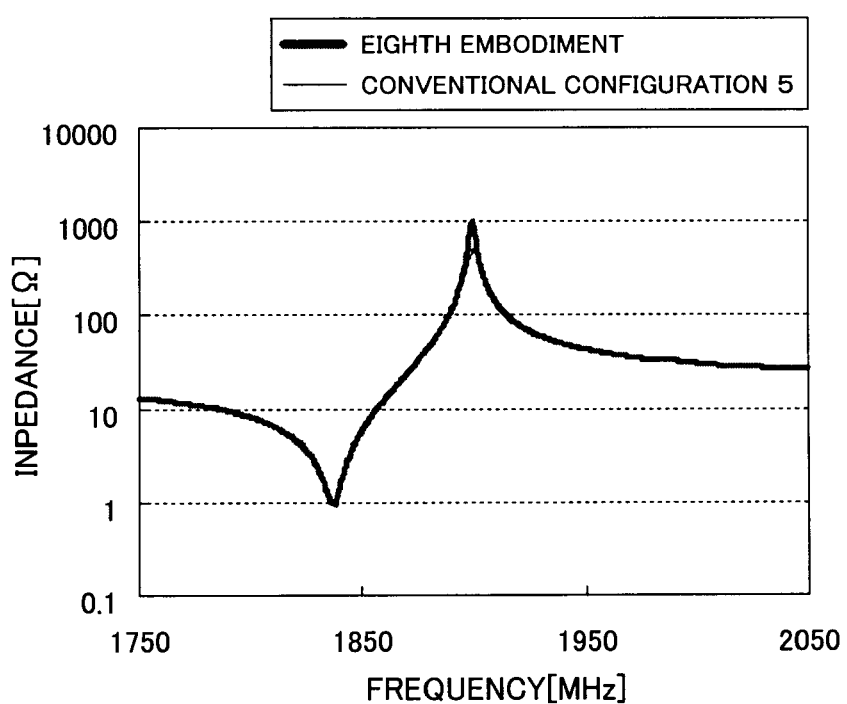
FIG. 30 is a graph showing the frequency-impedance characteristic of a SAW resonator built in the longitudinally coupled multi-mode SAW filter according to the eighth embodiment.

FIG. 30 shows the result of measuring the frequency-impedance characteristic of the SAW resonator comprised by this embodiment. As can be seen from FIG. 30, the resonator to which the present invention is applied can improve the Q-value by 6.3 dB from 54.2 dB to 60.5 dB as compared with the conventional resonator (conventional structure 5) which does not comprise branch electrodes.

Figure 31:
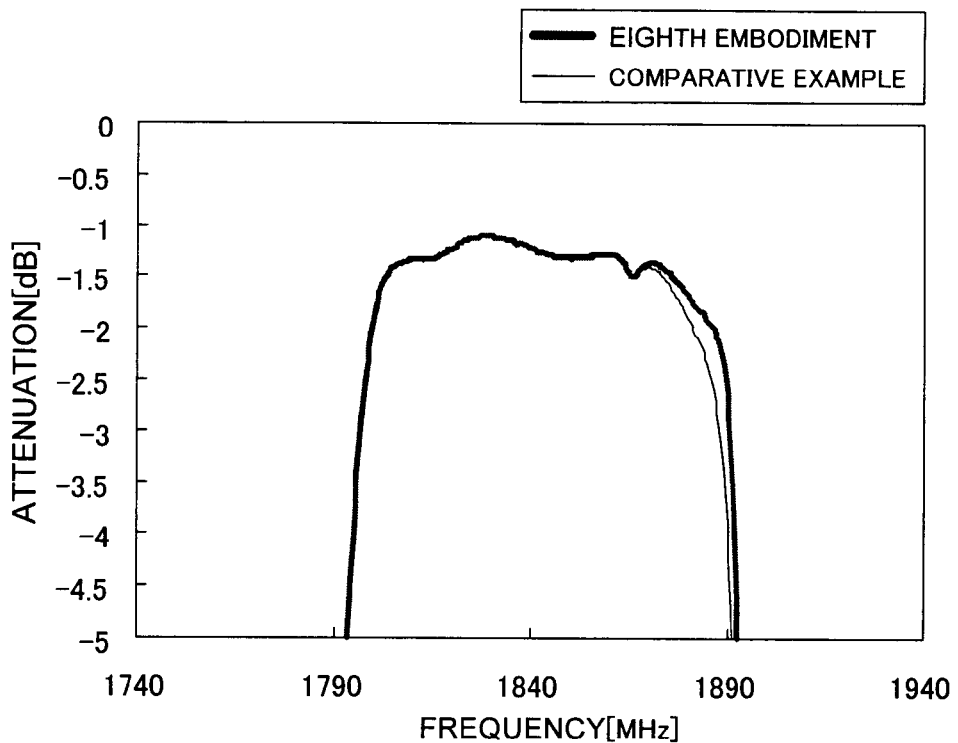
FIG. 31 is a graph showing the frequency characteristic in a pass band of the longitudinally coupled multi-mode SAW filter according to the eighth embodiment.

FIG. 31 in turn shows the frequency characteristic in the pass band of the filter of this embodiment together with the characteristic of a comparative example. In this regard, the comparative example uses an ordinary (conventional) resonator which does not comprise branch electrodes as the resonator 161 connected in series in the filter structure shown in FIG. 28 (any of the two longitudinally coupled multi-mode SAW filters connected in parallel has branch electrodes). As is apparent from FIG. 31, it is understood that further improvements in characteristics, particularly a loss improvement effect on the higher side of the pass band can be achieved by not only applying the present invention to the longitudinally coupled multi-mode SAW filters connected in parallel but also applying the present invention to the resonator connected in series to these filters.

Ninth Embodiment

Figure 32:
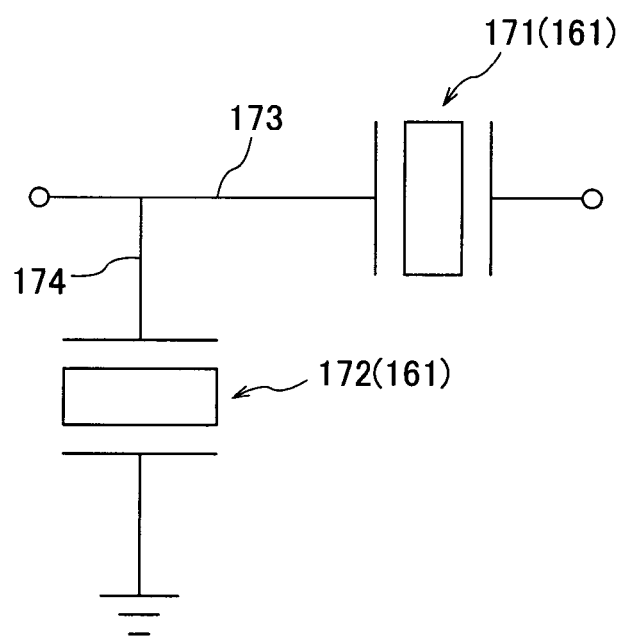
FIG. 32 is a diagram showing the basic configuration of a ladder type SAW filter according to a ninth embodiment of the present invention.

The SAW resonator to which the present invention is applied can be utilized in a ladder type SAW filter as well. FIG. 32 shows the basic configuration of such a ladder type circuit, and a ninth embodiment of the present invention configures a ladder type SAW filter using the SAW resonator 161 according to the seventh embodiment as a series arm resonator disposed on a transmission line 173 which connects an input terminal to an output terminal, and a parallel arm resonator disposed on a branch path 174 branched from the transmission path 173 and connected to the ground, respectively. According to such a filter, the insertion loss can be improved by using the SAW resonator 161, the Q-value of which is improved.

The series arm resonator 171 and parallel arm resonator 172 may be provided in an arbitrary number equal to or more than one, whereby a ladder type SAW filters at two or more stages can be configured. Also, the ladder type filter is not necessarily required to have all resonators configured by the resonators 161 according to the present invention (all the resonators may be the resonators 161 of the present invention, as a matter of fact), but may be a filter which uses the resonator 161 according to the present invention only in some of the resonators. Further, a lattice circuit may be provided.

While embodiments of the present invention have been described above, the present invention is not so limited, but can be modified in a variety of ways within the scope described in the claims, as will be apparent to those skilled in the art.

For example, the dimension numerical values of each portion and the number of electrodes of the filter (IDT and resonator), the thicknesses of the electrodes, the type of the piezo-electric substrate, and the like are described simply in an illustrative sense, and other numerical values and configurations can of course be employed. Also, while the electrodes are formed of an Al single crystal film in the embodiments, an Al alloy, Cu, Au or the like may be used, and a laminate structure can be used by laminating a plurality of types of materials. Also, while an LT substrate is used as a piezo-electric substrate in the embodiments, for example, an LN (LiNbO$_3$) substrate, a crystal substrate, a substrate made of piezo-electric ceramics such as lead zirconate titanate based piezo-electric ceramics, and other piezo-electric substrates may be used. Also, while the piezo-electric substrate undergoes the processing for improving the pyro-electric property in the embodiments, the processing is not essential.

Further, while the foregoing embodiments have used a filter which has three IDTs arranged in the propagation direction as a longitudinally coupled multi-mode filter, the present invention can also be applied to a so-called 2-IDT which has two IDTs arranged, and a so-called 4-IDT or more longitudinally coupled multi-mode filter having four or more IDTs arranged. In regard to the input/output terminals, in the first to sixth and eighth embodiments, the input terminal is an unbalanced terminal, and the output terminal is a balanced terminal, but these input side terminal and output side terminal can be either an unbalanced terminal or a balanced terminal.

Figure 33A:
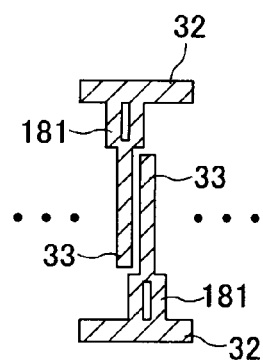
FIGS. 33A to 33F are diagrams each showing other exemplary shapes of an interdigital electrode and a branch electrode of IDT which forms part of a filter or a resonator according to the present invention.
Figure 33B:
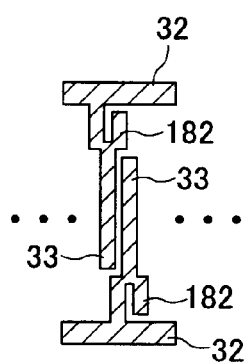
Figure 33C:
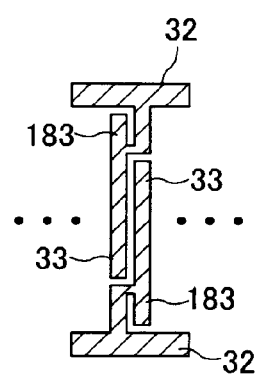

The shapes of the interdigital electrodes and branch electrodes are not limited to the examples shown in the drawings, and particularly for the shape in the non-overlap zone, a variety of shapes can be employed for both the interdigital electrodes and branch electrodes. For example, FIGS. 33A to 33F show other exemplary shapes of electrodes. As shown in FIGS. 33A to 33C, an interdigital electrode 33 may be bent in a crank shape in a non-overlap zone, and L-shaped or linearly shaped branch electrodes 181, 182, 183 maybe connected to the proximal end of the interdigital electrode 33 made in the crank shape. Also, in the present invention, the center of the interdigital electrode may shift from the center of the branch body of the branch electrode (for example, see FIGS. 33A, 33B).

Figure 33D:
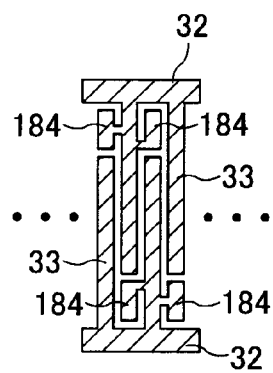
Figure 33E:
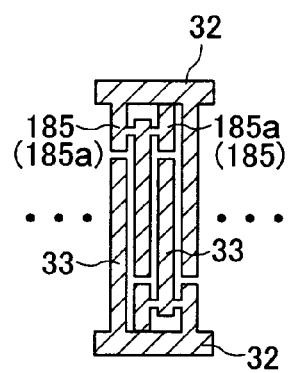
Figure 33F:
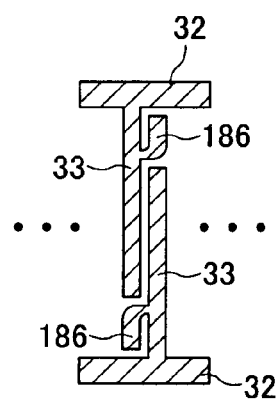

Also, as shown in FIG. 33D, branch electrodes 184 may be provided on both sides of the interdigital electrode 33, and as shown in FIG. 33E, the shape can be made to provide a connection electrode 185 to a buss bar so as to branch from the body portion of the interdigital electrode 33 which forms part of an overlap zone, and a branch electrode 185a as referred to in the present invention. Further, as shown in FIG. 33F, the branch electrode 186 may have a curved portion. Other than the examples shown in FIGS. 33A to 33F, a variety of electrode shapes can be employed.

What is claimed is:

1. A surface acoustic wave filter comprising:
an interdigital transducer disposed on a piezo-electric substrate, said interdigital transducer including comb-shaped electrodes having a plurality of interdigital electrodes arranged in a propagation direction of surface acoustic waves and bus bars for connecting these interdigital electrodes, arranged in opposition, said interdigital electrodes being so overlapped as to insert with one another, wherein
said interdigital transducer includes,
one or more branch electrodes branched from at least one of said interdigital electrodes and positioned in a non-overlap zone between an overlap zone at which said interdigital electrodes overlap and a bus bar,
said one or more branch electrodes includes a branch electrode body extending in a direction substantially orthogonal to the propagation direction of surface acoustic waves, and
said one or more branch electrodes has a leading end electrically opened.

2. A surface acoustic wave filter according to claim 1, wherein:
W1≧0.08λ is established,
where λ is an electrode period of the interdigital electrodes, and W1 is a width of the one or more branch electrodes.

3. A surface acoustic wave filter according to claim 1, wherein:
G1≦0.36λ is established,
where λ is an electrode period of the interdigital electrodes, and G1 is a spacing between an end of said branch electrode body on the overlap zone side and a leading end of an interdigital electrode of an opposing comb-shaped electrode.

4. A surface acoustic wave filter according to claim 1, wherein:
L1≧0.12λ is established,
where λ is an electrode period of the interdigital electrodes, and L1 is a length of said branch electrode body.

5. A surface acoustic wave filter according to claim 1, wherein:
a piezo-electric substrate which undergoes pyro-electric property improvement processing as said piezo-electric substrate.

6. A longitudinally coupled multi-mode surface acoustic wave filter comprising:
a plurality of interdigital transducers disposed on a piezo-electric substrate so as to be acoustically coupled in a propagation direction of surface acoustic waves, each of the plurality of interdigital transducers including comb-shaped electrodes having a plurality of interdigital electrodes arranged in the propagation direction of surface acoustic waves and bus bars for connecting these interdigital electrodes, arranged in opposition, said interdigital electrodes being crossed with one another, wherein
each said plurality of interdigital transducers includes,
one or more branch electrodes branched from at least one of said interdigital electrodes and positioned in a non-overlap zone between an overlap zone at which said interdigital electrodes overlap and a bus bar,
said one or more branch electrodes includes a branch electrode body extending in a direction substantially orthogonal to the propagation direction of surface acoustic waves, and
said one or more branch electrodes has a leading end electrically opened.

7. A longitudinally coupled multi-mode surface acoustic wave filter comprising:
a first surface acoustic wave filter and a second surface acoustic wave filter connected in parallel with each other, wherein
the surface acoustic wave filter according to claim 6 is used as said first surface acoustic wave filter and said second surface acoustic wave filter.

8. A longitudinally coupled multi-mode surface acoustic wave filter, comprising:
a surface acoustic wave resonator connected in series to the longitudinally coupled multi-mode surface acoustic wave filter according to claim 7.

9. A longitudinally coupled multi-mode surface wave filter comprising:
a surface acoustic wave resonator connected in series to the longitudinally coupled multi-mode surface acoustic wave filter according to claim 7, wherein
said surface acoustic wave resonator includes,
an interdigital transducer disposed on a piezo-electric substrate, said interdigital transducer including comb-shaped electrodes having a plurality of interdigital electrodes arranged in a propagation direction of surface acoustic waves and bus bars for connecting these interdigital electrodes, arranged in opposition, said interdigital electrodes being crossed with one another,
said interdigital transducer including one or more branch electrodes branched from at least one of said interdigital electrodes and positioned in a non-overlap zone between an overlap zone at which said interdigital electrodes overlap and a bus bar, and
said one or more branch electrodes includes a branch electrode body extending in a direction substantially orthogonal to the propagation direction of surface acoustic waves.

10. A longitudinally coupled multi-mode surface acoustic wave filter, comprising:
a surface acoustic wave resonator connected in series to the longitudinally coupled multi-mode surface acoustic wave filter according to claim 6.

11. A longitudinally coupled multi-mode surface acoustic wave filter comprising:
a surface acoustic wave resonator connected in series to the longitudinally coupled multi-mode surface acoustic wave filter according to claim 6, wherein
said surface acoustic wave resonator includes,
an interdigital transducer disposed on a piezo-electric substrate, said interdigital transducer including comb-shaped electrodes having a plurality of interdigital electrodes arranged in a propagation direction of surface acoustic waves and bus bars for connecting these interdigital electrodes, arranged in opposition, said interdigital electrodes being crossed with one another, said interdigital transducer including one or more branch electrodes branched from at least one of said interdigital electrodes and positioned in a non-overlap zone between an overlap zone at which said interdigital electrodes overlap and a bus bar, and said one or more branch electrodes includes a branch electrode body extending in a direction substantially orthogonal to the propagation direction of surface acoustic waves.

12. A surface acoustic wave filter according to claim 6, wherein:
$W1 \geq 0.08\lambda$ is established,
where $\lambda$ is an electrode period of the interdigital electrodes, and W1 is a width of the one or more branch electrodes.

13. A surface acoustic wave filter according to claim 6, wherein:
$G1 \leq 0.36\lambda$ is established,
where $\lambda$ is an electrode period of the interdigital electrodes, and G1 is a spacing between an end of said branch electrode body on the overlap zone side and a leading end of an interdigital electrode of an opposing comb-shaped electrode.

14. A surface acoustic wave filter according to claim 6, wherein:
$L1 \geq 0.12\lambda$ is established,
where $\lambda$ is an electrode period of the interdigital electrodes, and L1 is a length of said branch electrode body.

15. A surface acoustic wave filter according to claim 6, wherein:
a piezo-electric substrate which undergoes pyro-electric property improvement processing as said piezo-electric substrate.

16. A surface acoustic wave resonator comprising:
an interdigital transducer disposed on a piezo-electric substrate, said interdigital transducer including comb-shaped electrodes having a plurality of interdigital electrodes arranged in a propagation direction of surface acoustic waves and bus bars for connecting these interdigital electrodes, arranged in opposition, said interdigital electrodes being crossed with one another, wherein said interdigital transducer includes, one or more branch electrodes branched from at least one of said interdigital electrodes and positioned in a non-overlap zone between an overlap zone at which said interdigital electrodes overlap and a bus bar, said one or more branch electrodes includes a branch electrode body extending in a direction substantially orthogonal to the propagation direction of surface acoustic waves, and said one or more branch electrodes has a leading end electrically opened.

17. A surface acoustic wave resonator according to claim 16, wherein:
$W1 \geq 0.08\lambda$ is established,
where $\lambda$ is an electrode period of the interdigital electrodes, and W1 is a width of the one or more branch electrodes.

18. A surface acoustic wave resonator according to claim 16, wherein:
$G1 \leq 0.36\lambda$ is established,
where $\lambda$ is an electrode period of the interdigital electrodes, and G1 is a spacing between an end of said branch electrode body on the overlap zone side and a leading end of an interdigital electrode of an opposing comb-shaped electrode.

19. A surface acoustic wave resonator according to claim 16, wherein:
$L1 \geq 0.12\lambda$ is established,
where $\lambda$ is an electrode period of the interdigital electrodes, and L1 is a length of said branch electrode body.

20. A ladder type surface acoustic wave filter comprising:
one or more series arm resonators connected in series on a transmission path between an input terminal and an output terminal; and one or more parallel arm resonators connected to a branch path branched from the transmission path, wherein the surface acoustic wave resonator according to claim 16 is used as at least one resonator of said one or more series arm resonators and one or more parallel arm resonators.

21. A surface acoustic wave filter according to claim 20, wherein:
a piezo-electric substrate which undergoes pyro-electric property improvement processing as said piezo-electric substrate.

22. A surface acoustic wave resonator according to claim 16, wherein:
a piezo-electric substrate which undergoes pyro-electric property improvement processing as said piezo-electric substrate.

* * * * *